(12) United States Patent
Ponoth et al.

(10) Patent No.: US 8,476,160 B2
(45) Date of Patent: Jul. 2, 2013

(54) SUBLITHOGRAPHIC PATTERNING EMPLOYING IMAGE TRANSFER OF A CONTROLLABLY DAMAGED DIELECTRIC SIDEWALL

(75) Inventors: Shom Ponoth, Clifton Park, NY (US); David V. Horak, Essex Junction, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 374 days.

(21) Appl. No.: 12/913,116

(22) Filed: Oct. 27, 2010

(65) Prior Publication Data

US 2012/0104619 A1    May 3, 2012

(51) Int. Cl.
*H01L 21/4763* (2006.01)
*H01L 23/48* (2006.01)

(52) U.S. Cl.
USPC ........... 438/618; 438/620; 438/666; 257/773; 257/E21.575; 257/E21.579

(58) Field of Classification Search
USPC .......... 438/618, 620, 666; 257/773, E21.575, 257/E21.597
See application file for complete search history.

(56) References Cited

U.S. PATENT DOCUMENTS

| | | | |
|---|---|---|---|
| 6,875,703 B1 | 4/2005 | Furukawa et al. | |
| 7,265,013 B2 | 9/2007 | Furukawa et al. | |
| 7,358,140 B2 | 4/2008 | Furukawa et al. | |
| 7,381,655 B2 | 6/2008 | Furukawa et al. | |
| 7,855,138 B2 * | 12/2010 | Nishizawa | 438/618 |
| 2005/0153536 A1 * | 7/2005 | Soda | 438/622 |
| 2007/0264820 A1 * | 11/2007 | Liu et al. | 438/624 |
| 2011/0049503 A1 * | 3/2011 | Nishizawa | 257/40 |

* cited by examiner

*Primary Examiner* — Long Tran
(74) *Attorney, Agent, or Firm* — Scully, Scott, Murphy & Presser, P.C.; Parashos Kalaitzis, Esq.

(57) ABSTRACT

A first low dielectric constant (low-k) dielectric material layer is lithographically patterned to form a recessed region having expose substantially vertical sidewalls, which are subsequently damaged to de-carbonize a surface portion at the sidewalls having a sublithographic width. A second low-k dielectric material layer is deposited to fill the recessed region and planarized to exposed top surfaces of the damaged low-k dielectric material portion. The damaged low-k dielectric material portion is removed selective to the first and second low-k dielectric material layers to form a trench with a sublithographic width. A portion of the pattern of the sublithographic-width trench is transferred into a metallic layer and optionally to an underlying dielectric masking material layer to define a trench with a sublithographic width, which can be employed as a template to confine the widths of via holes and line trenches to be subsequently formed in an interconnect-level dielectric material layer.

16 Claims, 30 Drawing Sheets

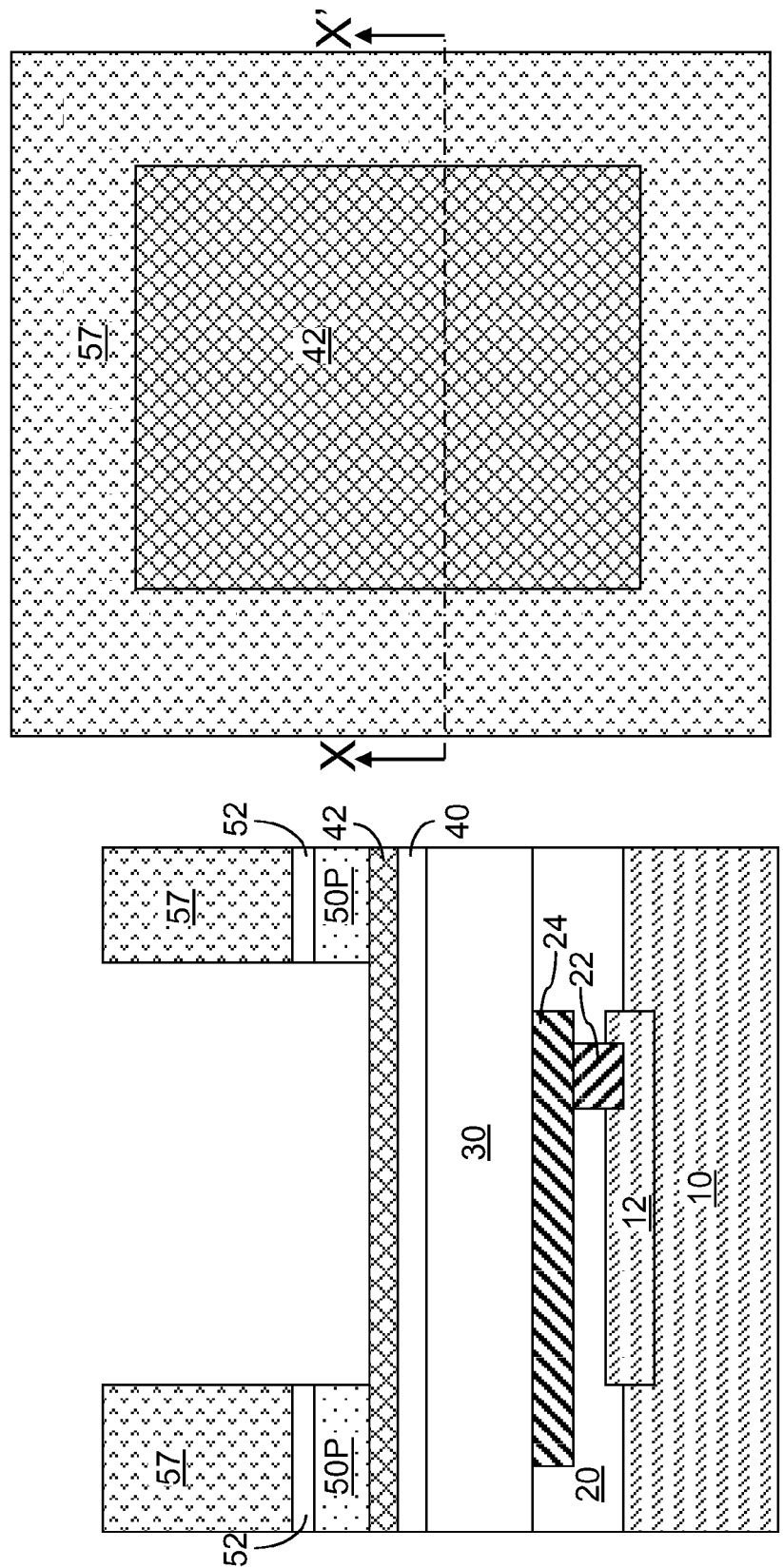

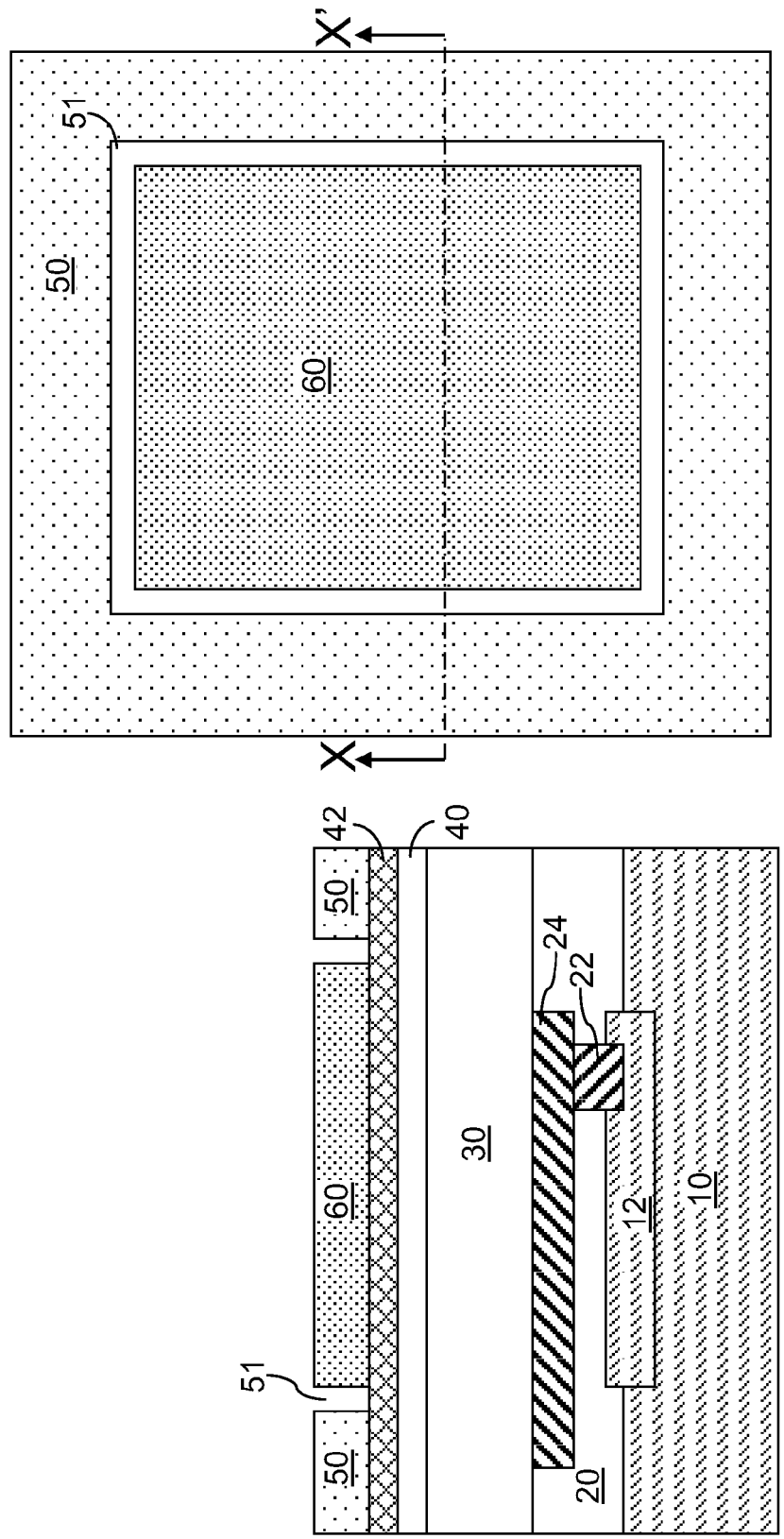

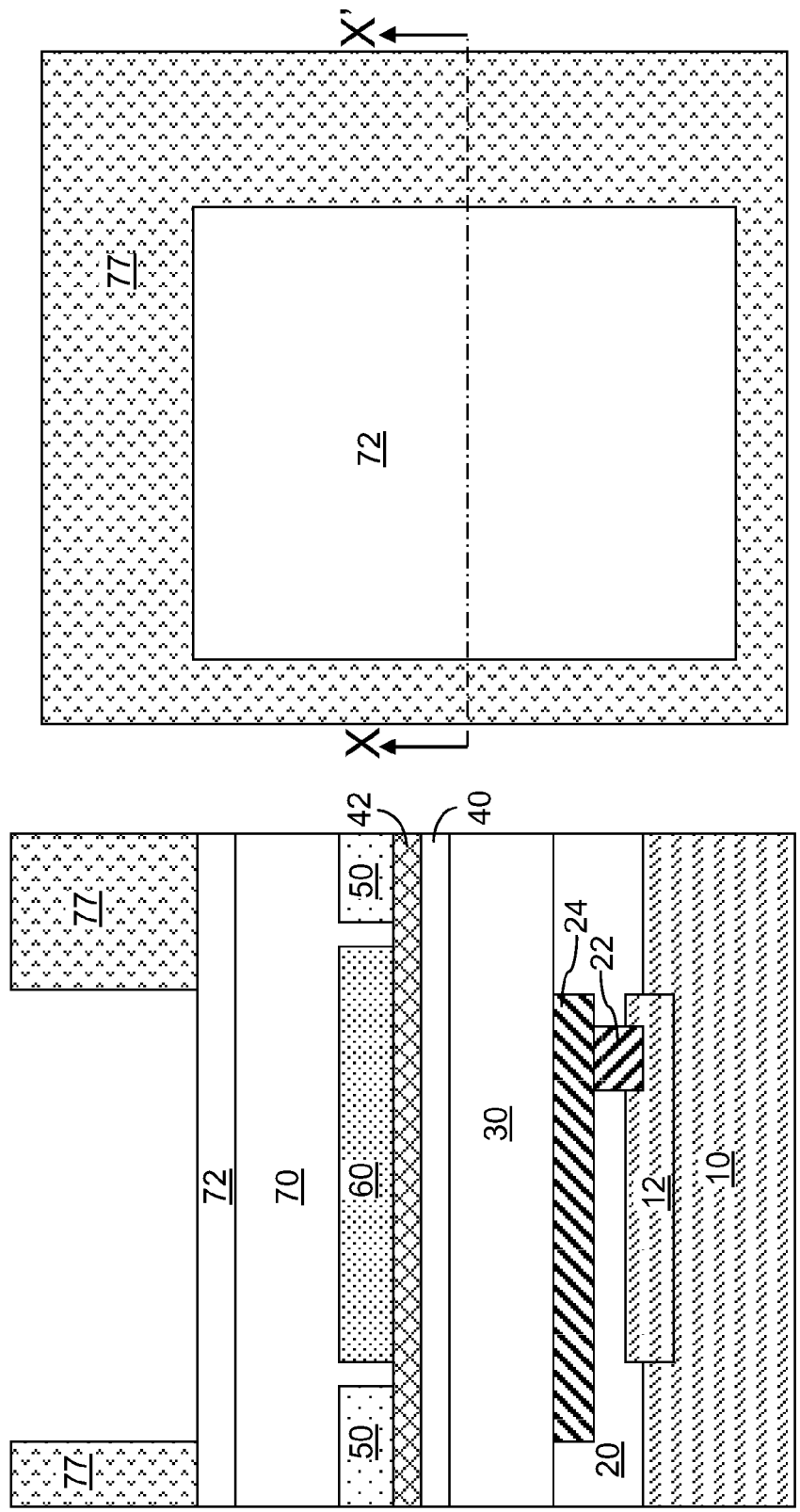

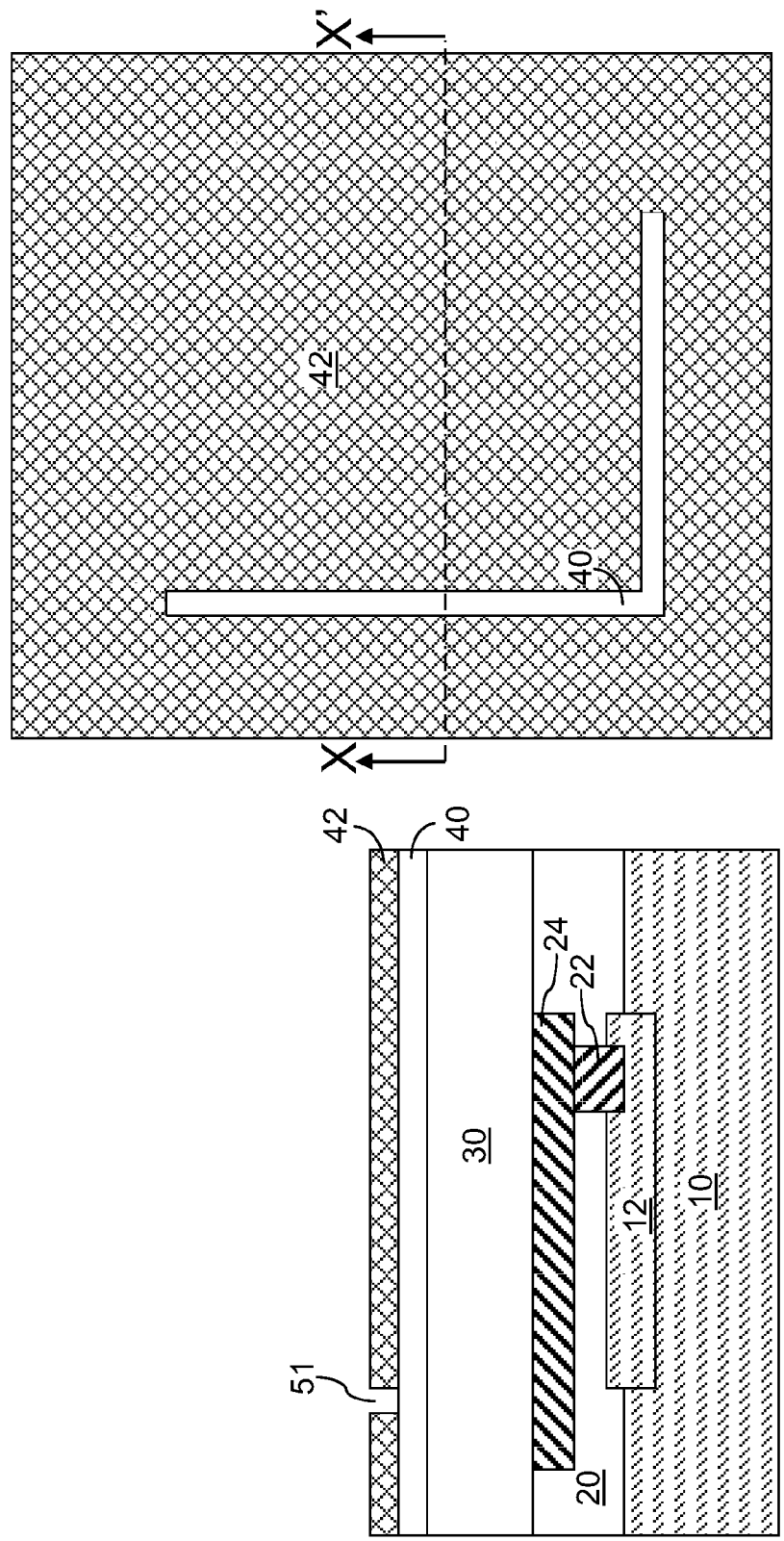

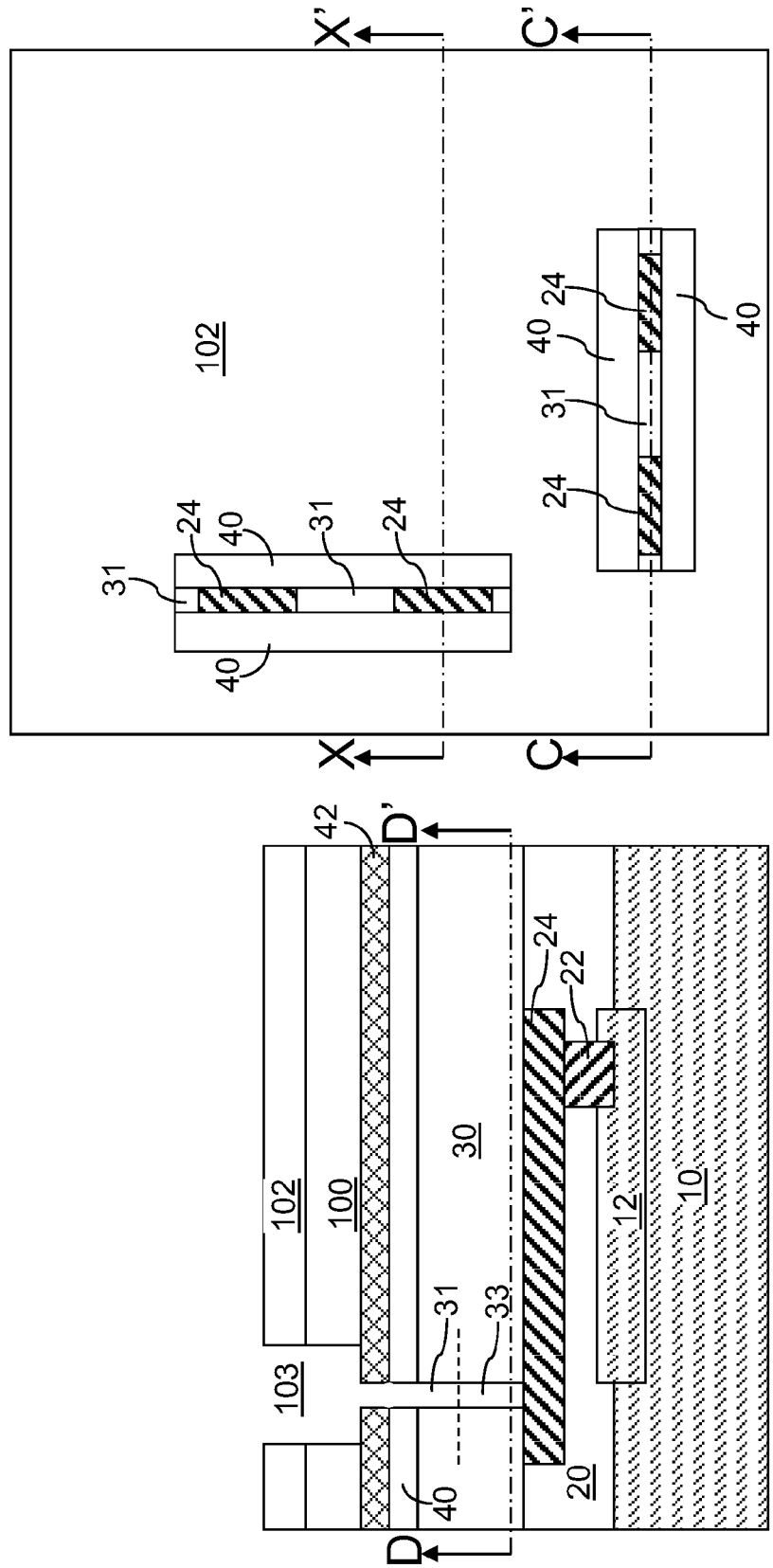

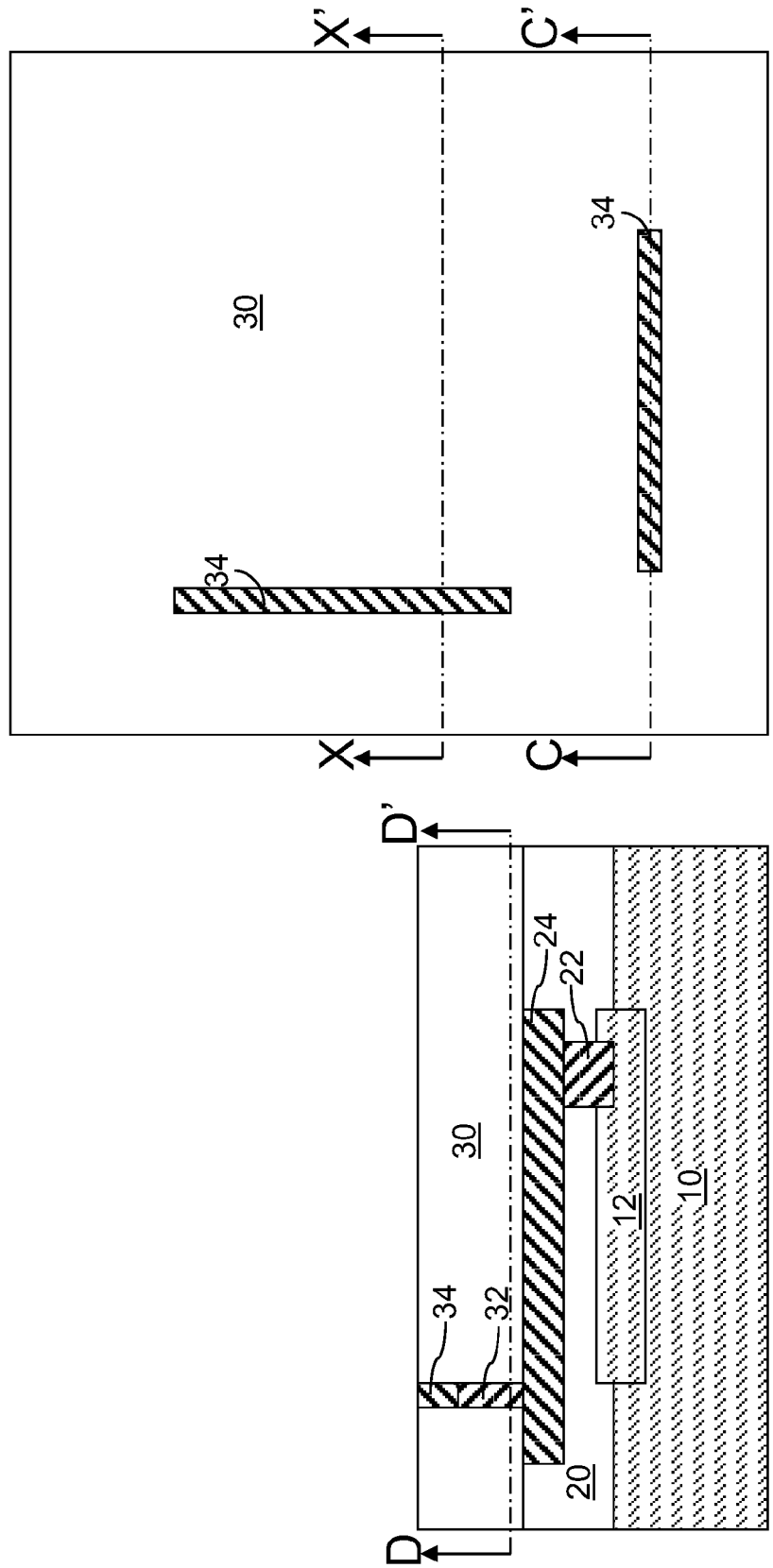

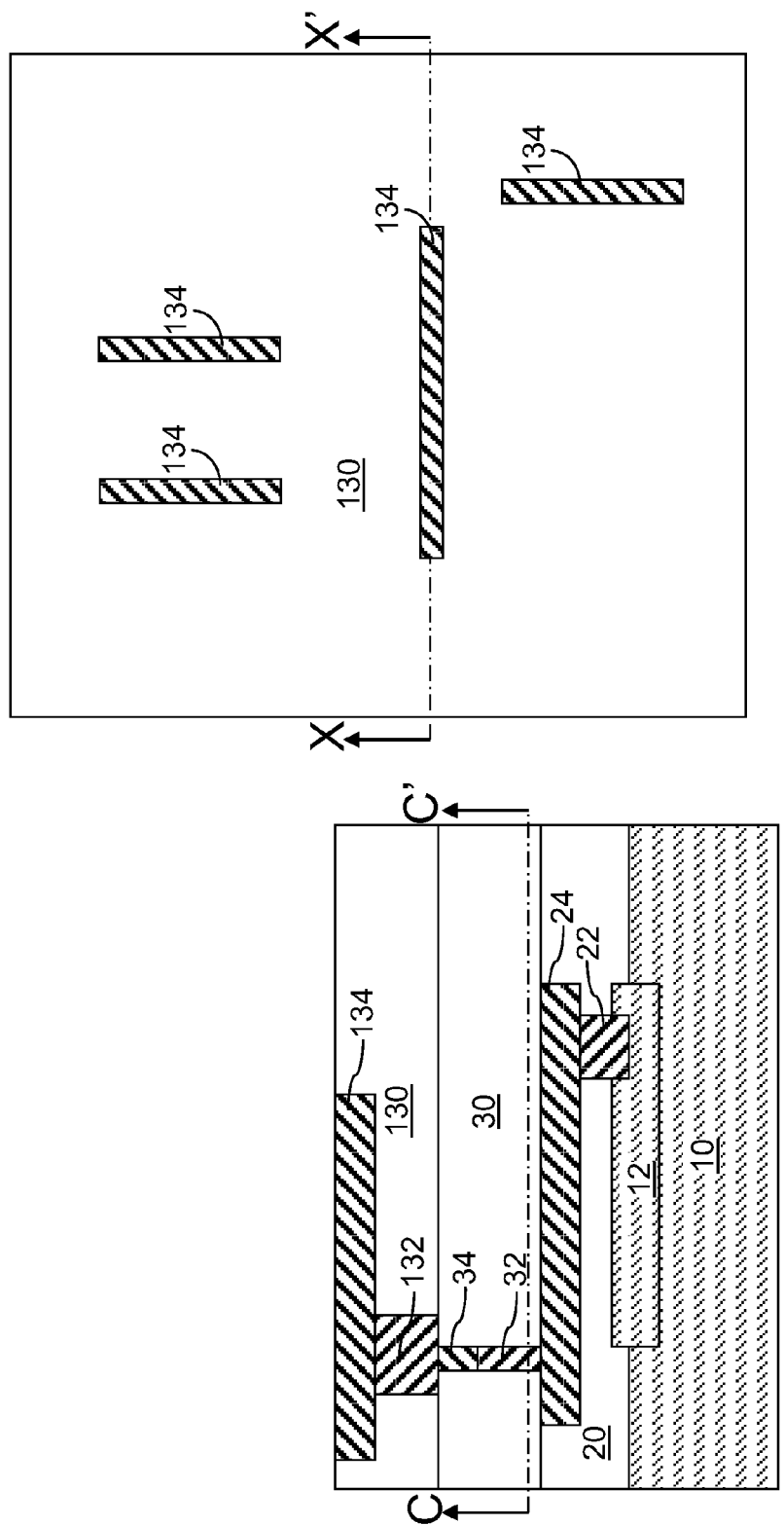

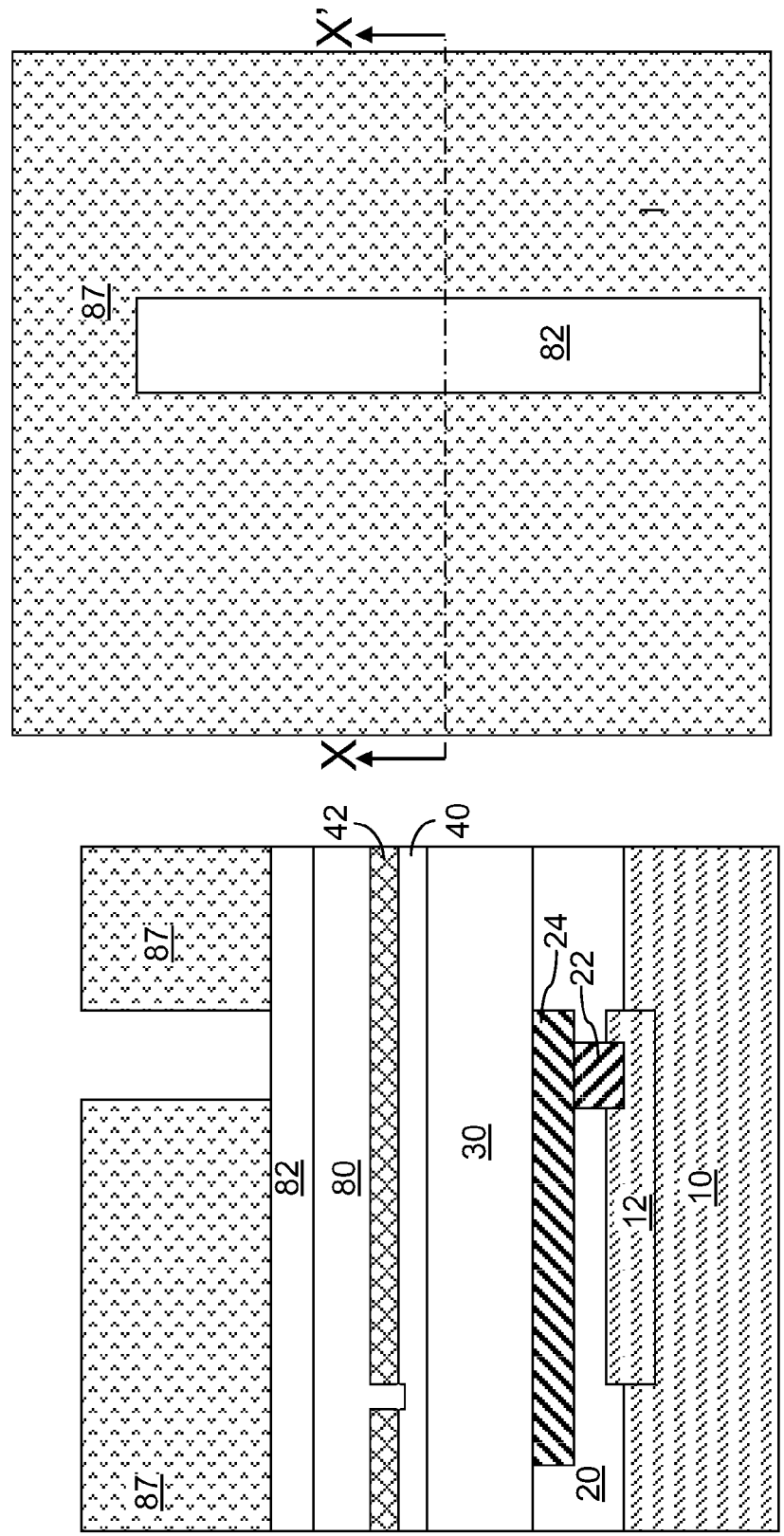

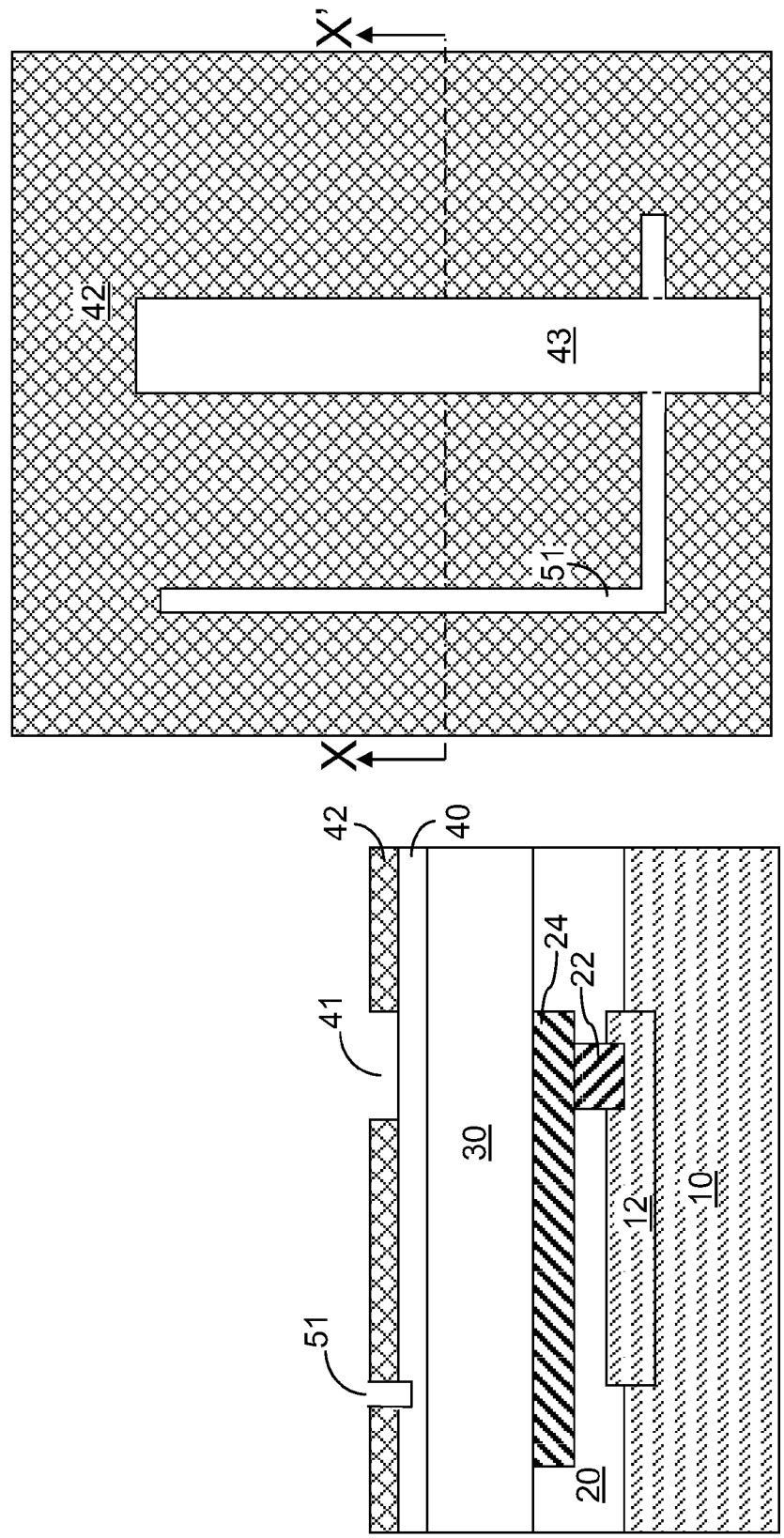

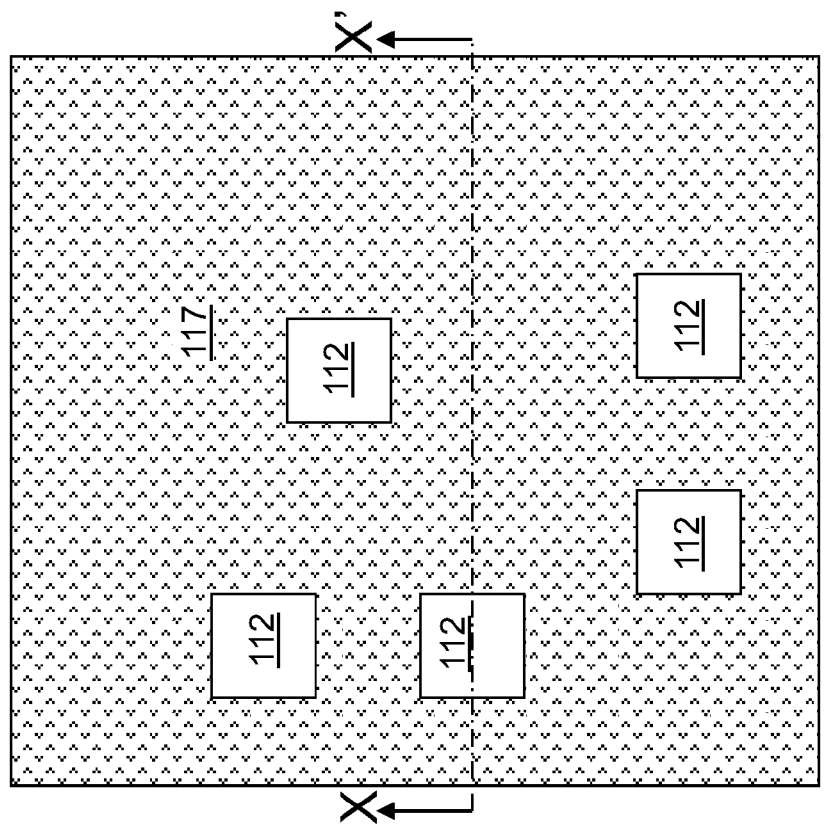
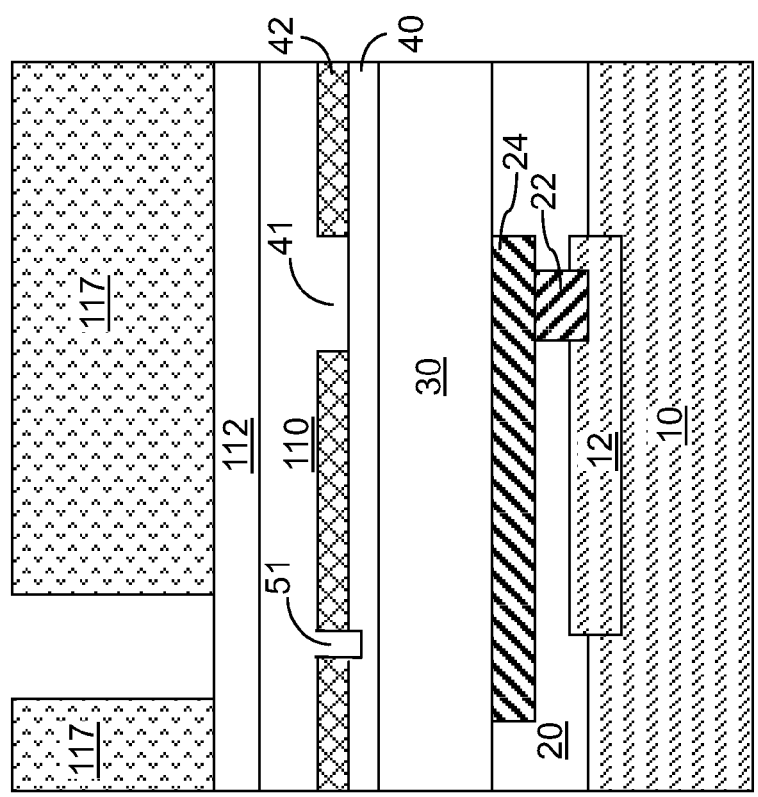
FIG. 22A
FIG. 22B

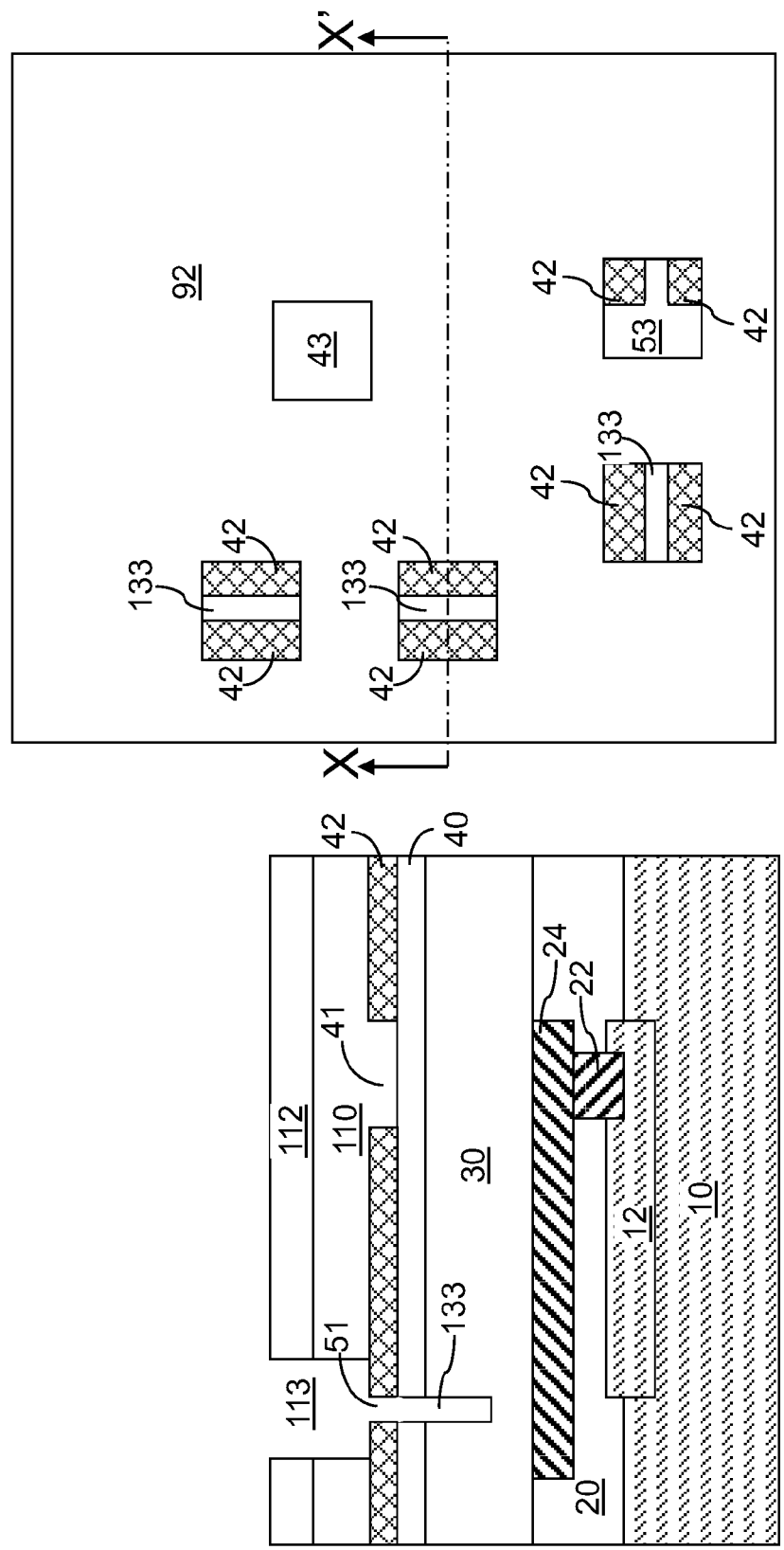

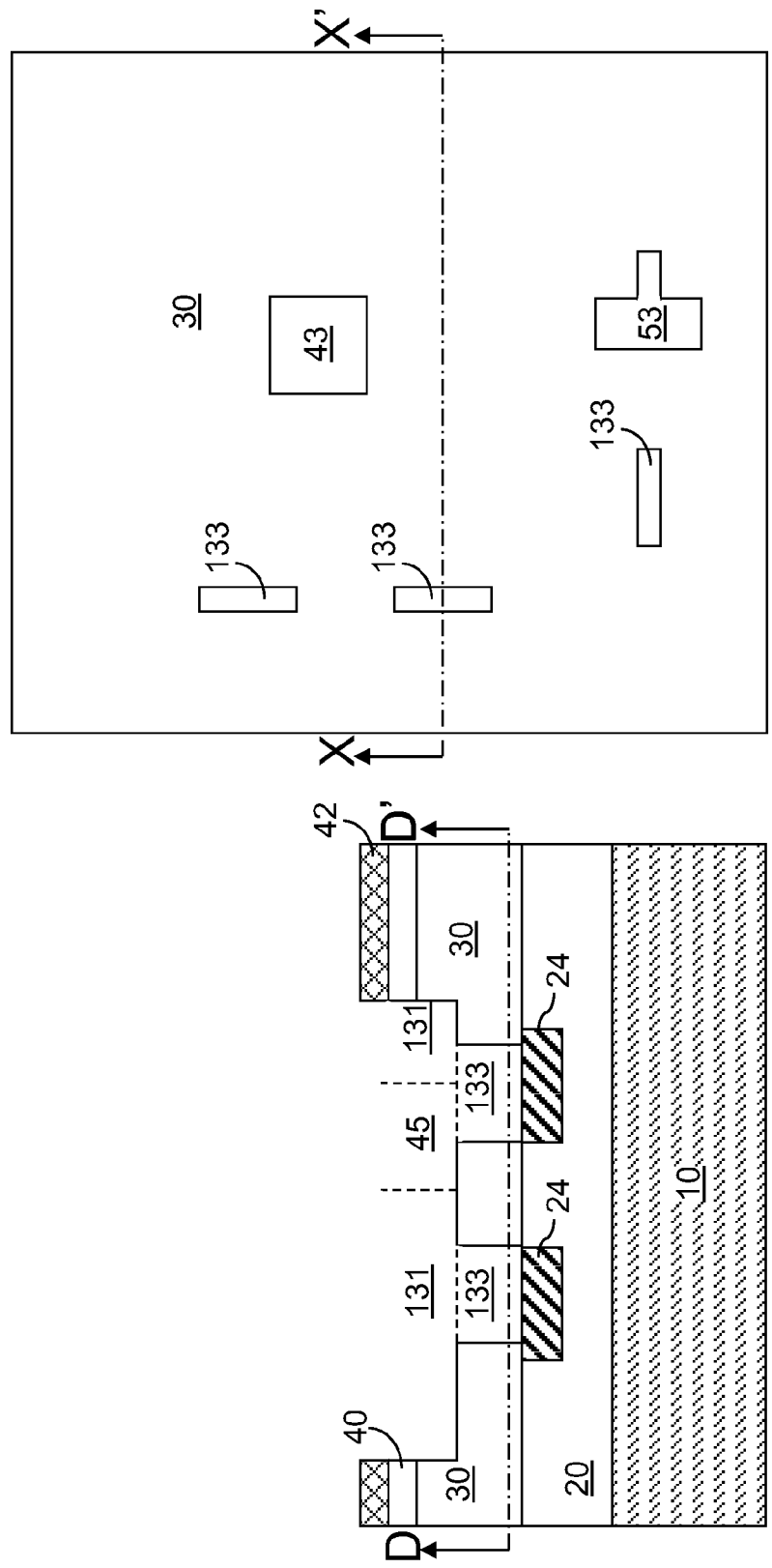

SUBLITHOGRAPHIC PATTERNING EMPLOYING IMAGE TRANSFER OF A CONTROLLABLY DAMAGED DIELECTRIC SIDEWALL

BACKGROUND

The present disclosure relates to methods of forming sublithographic patterns, and particularly to methods of sublithographic patterning employing image transfer of a controllably damaged dielectric sidewall, and structures employed to effect the same.

Lithographic capabilities are one of the significant technological limitations that constrain the continued scaling of semiconductor devices. Specifically, lithographic techniques to reliably print dimensions less than 30 nm are not commercially available as of 2010. While electron beam lithography has been proposed as a potential solution to enable printing of dimensions of less than 30 nm, a reliable electron beam lithography system has yet to be provided.

Despite the unavailability of suitable lithographic tools, enhancement in device density and performance in advanced semiconductor devices require continued shrinking of feature sizes including dimensions of metal interconnect structures.

BRIEF SUMMARY

A first low dielectric constant (low-k) dielectric material layer is lithographically patterned to form a recessed region having expose substantially vertical sidewalls, which are subsequently damaged to de-carbonize a surface portion at the sidewalls having a sublithographic width. A second low-k dielectric material layer is deposited to fill the recessed region and planarized to exposed top surfaces of the damaged low-k dielectric material portion. The damaged low-k dielectric material portion is removed selective to the first and second low-k dielectric material layers to form a trench with a sublithographic width. A portion of the pattern of the sublithographic-width trench is transferred into a metallic layer to define a trench with a sublithographic width, which can be employed as a template to confine the widths of via holes and line trenches to be subsequently formed in an interconnect-level dielectric material layer. Alternatively, the pattern of the trench in the metallic layer can be transferred to a dielectric masking material layer employing another mask that limits the area of pattern transfer, and the patterned dielectric masking material layer can be employed as a template to confine the widths of via holes and line trenches to be subsequently formed in the interconnect-level dielectric material layer.

According to an aspect of the present disclosure, a method of forming a structure includes: forming a stack including at least a metallic layer and a first low dielectric constant (low-k) dielectric material layer comprising carbon on a substrate; exposing a sidewall of the first low-k dielectric material layer by forming a recessed region therein; forming a damaged sidewall portion by de-carbonizing a portion of the first low-k dielectric material layer located at the sidewall; filling the recessed region with a second low-k dielectric material layer and planarizing the second low-k dielectric material layer, wherein a top surface of the damaged sidewall portion is exposed; removing the damaged sidewall portion selective to an undamaged portion of the first low-k dielectric material layer and the second low-k dielectric material layer, wherein a line cavity is formed between the undamaged portion of the first low-k dielectric material layer and the second low-k dielectric material layer; and transferring a pattern of at least a portion of the line cavity into the metallic layer, wherein a trench of a constant width is formed within the metallic layer to form a patterned metallic layer.

According to another aspect of the present disclosure, a structure includes: a metallic layer located on a substrate; and a layer contacting a top surface of the metallic layer, said layer including a damaged portion of a first low dielectric constant (low-k) dielectric material layer, an undamaged portion of the first low-k dielectric material layer, and a second low-k dielectric material layer, wherein the damaged portion of the first low-k dielectric material layer laterally contacts the undamaged portion of the first low-k dielectric material layer and the second dielectric material layer, and the damaged portion of the first low-k dielectric material layer includes a lower atomic concentration of carbon than the undamaged portion of the first low-k dielectric material layer.

BRIEF DESCRIPTION OF THE SEVERAL VIEWS OF THE DRAWINGS

In all drawings of this disclosure, figures labeled with the same numeric numeral correspond to the same step of processing. Figures with the suffix "A" are vertical cross-sectional views, and figures with the suffix "B" are top-down views. The plane X-X' in figures with the suffix "B" is the plane of the vertical cross-sectional view of the figure labeled with the same numeral and having the suffix "A."

FIGS. 2A and 2B show the first exemplary structure of FIGS. 1A and 1B after lithographic patterning of the photoresist and transfer of the pattern in the photoresist into the ARC layer and the first low-k dielectric material layer.

FIGS. 6A and 6B show the first exemplary structure of FIGS. 5A and 5B after removing the damaged portion of the first low-k dielectric material layer selective to the undamaged portion of the first low-k dielectric material layer and the second low-k dielectric material layer.

FIGS. 7A and 7B show the first exemplary structure of FIGS. 6A and 6B after deposition of a first optical planarizing layer, a first ARC layer, and a first photoresist and lithographic patterning of the first photoresist.

FIGS. 10A and 10B show the first exemplary structure of FIGS. 9A and 9B after removal of the first optical planarizing layer, the undamaged portion of the first low-k dielectric material layer, and the second low-k dielectric material layer.

FIGS. 14A, 14B, 14C, and 14D show the first exemplary structure of FIGS. 13A and 13B after transfer of the pattern in the third photoresist into the third ARC layer and the third optical planarizing layer, a subsequent transfer, through the dielectric masking material layer and into an upper portion of the interconnect-level dielectric material layer, of another composite pattern that is an intersection of the pattern in the metallic layer and the pattern in the third ARC layer and the third optical planarizing layer, and removal of the third photoresist. FIG. 14C is a vertical cross-sectional view of the first exemplary structure along the plane C-C' in FIGS. 14B and 14D. FIG. 14D is a horizontal cross-sectional view of the first exemplary structure along the plane D-D' in FIGS. 14A and 14C.

FIGS. 15A, 15B, 15C, and 15D show the first exemplary structure of FIGS. 14A-14D after removal of the third ARC layer and the third optical planarizing layer and formation of at least one metal interconnect structure including a conductive line structure and at least one conductive via structure in the interconnect-level dielectric material layer by deposition and planarization of a conductive material. The patterned metallic layer and the patterned dielectric masking material layer can be removed before or after deposition of a metal into the via holes and line trenches. FIG. 15C is a vertical cross-sectional view of the first exemplary structure along the plane C-C' in FIGS. 15B and 15D. FIG. 15D is a horizontal cross-sectional view of the first exemplary structure along the plane D-D' in FIGS. 15A and 15C.

FIGS. 16A and 16B show the first exemplary structure of FIGS. 15A-15D after formation of another metal interconnect structure in an overlying-level dielectric material layer, which may be formed by repetitively applying processing steps described above.

FIGS. 19A and 19B show the second exemplary structure of FIGS. 18A and 18B after depositing a line-level optical planarizing layer, a line-level ARC layer, and a line-level photoresist and lithographic patterning of the line-level photoresist.

FIGS. 21A and 21B show the second exemplary structure of FIGS. 20A and 20B after removal of the line-level ARC layer and the line-level optical planarizing layer.

FIGS. 22A and 22B show the second exemplary structure of FIGS. 21A and 21B after depositing a via-level optical planarizing layer, a via-level ARC layer, and a via-level photoresist, and lithographic patterning of the via-level photoresist.

FIGS. 23A and 23B show the second exemplary structure of FIGS. 22A and 22B after transfer of the pattern in the via-level photoresist into the via-level ARC layer and the via-level optical planarizing layer, and a subsequent transfer, through the dielectric masking material layer and into an upper portion of the interconnect-level dielectric material layer, of a composite pattern that is an intersection of the pattern in the dielectric masking material layer and the pattern in the via-level ARC layer and the second optical planarizing layer, and removal of the via-level photoresist.

FIGS. 25A, 25B, 25C, and 25D show the second exemplary structure of FIGS. 24A and 24B after the transfer of the pattern in the metallic layer through the dielectric masking material layer and an upper portion of the interconnect-level dielectric material layer. FIG. 25C is a vertical cross-sectional view of the second exemplary structure along the plane C-C' in FIGS. 25B and 25D. FIG. 25D is a horizontal cross-sectional view of the second exemplary structure along the plane D-D' in FIGS. 25A and 25C.

FIG. 26C is a vertical cross-sectional view of the second exemplary structure along the plane C-C' in FIGS. 26B and 26D. FIG. 26D is a horizontal cross-sectional view of the second exemplary structure along the plane D-D' in FIGS. 26A and 26C.

DETAILED DESCRIPTION

Figure 1B:
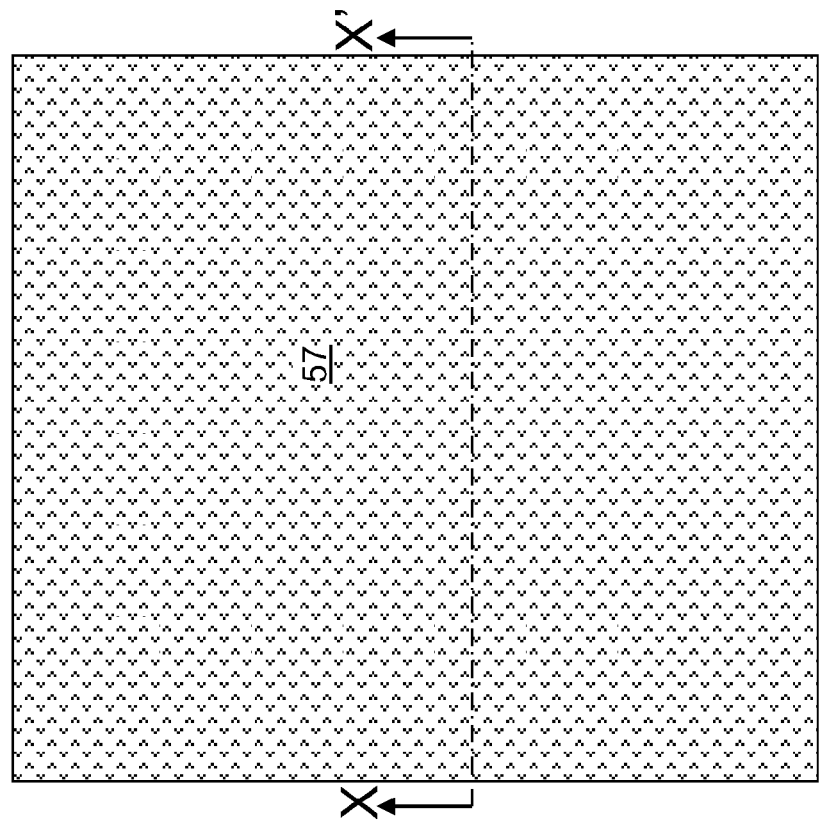
FIGS. 1A and 1B show a first exemplary structure including a stack of a substrate, an underlying-level dielectric layer, an interconnect-level dielectric material layer, a dielectric masking material layer, a metallic layer, a first low dielectric constant (low-k) dielectric material layer, an anti-reflective coating (ARC) layer, and a photoresist.

As stated above, the present disclosure relates to methods of sublithographic patterning employing image transfer of a controllably damaged dielectric sidewall, and structures employed to effect the same, which are now described in detail with accompanying figures. It is noted that like and corresponding elements are referred to by like reference numerals. The drawings are not in scale.

Figure 1A:
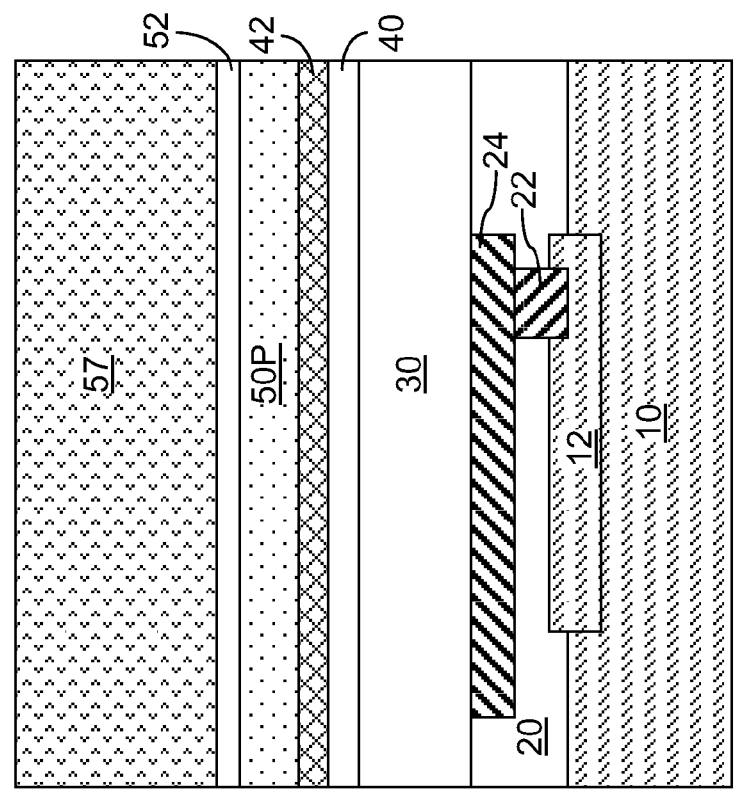

Referring to FIGS. 1A and 1B, a first exemplary structure of the present disclosure includes a stack of a substrate 10, an underlying-level dielectric layer 20, an interconnect-level dielectric material layer 30, a dielectric masking material layer 40, a metallic layer 42, a first low dielectric constant (low-k) dielectric material layer 50P, an anti-reflective coating (ARC) layer 52, and a photoresist 57.

The substrate 10 can be a semiconductor substrate including a semiconductor material, which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material comprises silicon. The substrate 10 can be a bulk substrate or a semiconductor-on-insulator (SOI) substrate.

At least one semiconductor device 12 may be present on the substrate 10. The at least one semiconductor device 12 can be a field effect transistor, a bipolar transistor, a diode, a resistor, a capacitor, an inductor, an electrically programmable fuse, or any combination thereof.

The underlying-level dielectric layer 20 can be a single dielectric material layer, a plurality of dielectric material layers, or can be absent depending on the implementation of the present disclosure. At least one conductive via structure 22 and/or at least one conductive line structure 24 can be embedded in the underlying-level dielectric layer 20. The least one conductive via structure 22 and/or at least one conductive line structure 24 are collectively referred to as underlying conductive interconnect structures, and are typically metallic structures, i.e., underlying metal interconnect structures.

The interconnect-level dielectric material layer 30 includes a dielectric material, which can be a conventional dielectric material such as undoped silicon oxide (undoped silicate glass), doped silicon oxide (doped silicate glass), silicon oxynitride, silicon nitride, or a combination thereof, or can be a low dielectric constant (low-k) material having a dielectric constant less than the dielectric constant of silicon oxide, i.e., 3.9. Low dielectric constant materials that can be employed for the interconnect-level dielectric material layer 30 include organosilicate glass including Si, C, O, H, and optionally N, methylated-hydrogen silsesquioxane (MSQ), and thermosetting polyarylene ethers, which is also commonly referred to as "Silicon Low-K", or "SiLK™." The term "polyarylene" herein denotes aryl moieties or inertly substituted aryl moieties which are linked together by bonds, fused rings, or inert linking groups such as oxygen, sulfur, sulfone, sulfoxide, carbonyl, etc. The low dielectric constant material can be deposited by chemical vapor deposition or by spin-coating, and can be porous or non-porous. The interconnect-level dielectric material layer 30 is formed at an interconnect level, i.e., at a level in which metal interconnect structures are subsequently formed. The thickness of the interconnect-level dielectric material layer 30 can be from 30 nm to 6,000 nm, and typically from 60 nm to 300 nm, although lesser and greater thicknesses can also be employed.

The dielectric masking material layer 40 includes a non-porous dielectric material such as silicon oxide, silicon nitride, silicon oxynitride, an organosilicate glass including Si, C, O, H, and N, a dielectric SiCH compound such as Blok™ (available from Applied Materials, Inc.), or a dielectric SiNCH compound such as NBloK™ (available from Applied Materials, Inc.). Dielectric SiCH compounds and dielectric SiNCH compounds have a dielectric constant of about 4.9. Dielectric SiCH compounds can be composed of 20 to 40 atomic % silicon, 12 to 40 atomic % carbon, and 20 to 55 atomic % hydrogen. Dielectric SiNCH compounds can be composed of 20 to 34 atomic % silicon, 12 to 34 atomic % carbon, 5 to 30 atomic % nitrogen, and 20 to 50 atomic % hydrogen. The dielectric masking material layer 40 can be deposited, for example, by chemical vapor deposition (CVD). The thickness of the dielectric masking material layer 40 can be from 5 nm to 50 nm, although lesser and greater thicknesses can also be employed. In one embodiment, the dielectric masking material layer 40 can be optional, i.e., can be omitted from the first exemplary structure. Although the drawings of the first exemplary structure illustrate embodiments in which the dielectric masking material layer 40 is present, one of ordinary skill in the art would appreciate the embodiment in which the dielectric masking material layer 40 is eliminated from the first exemplary structure.

The metallic layer 42 includes a metallic material such as an elemental transition metal, a nitride of an elemental transition metal, or a combination or a stack thereof. For example, the metallic layer 42 can be a layer of Ta, Ti, W, TaN, TiN, or WN. The metallic layer 42 can be formed, for example, by chemical vapor deposition (CVD) or physical vapor deposition (PVD). The thickness of the metallic layer 42 can be from 5 nm to 50 nm, although lesser and greater thicknesses can also be employed.

The molecules of a low-dielectric constant material contained within the first low-k dielectric material layer 50P include a carbon-containing group that can be removed by a plasma treatment. For example, the molecules of the first low-k dielectric material layer 50P can include a hydrocarbon group, which can be, but is not limited to, a methyl group ($-CH_3$) and an ethyl group ($-C_2H_5$). For example, the first low-k dielectric material layer 50P can include a porous or non-porous organosilicate glass including Si, C, O, and H. The first low-k dielectric material layer 50P can be formed, for example, by chemical vapor deposition (CVD) or spin-coating. The thickness of the first low-k dielectric material layer 50P can be from 30 nm to 400 nm, and typically from 60 nm to 200 nm, although lesser and greater thicknesses can also be employed.

The anti-reflective coating layer 52 includes an anti-reflective coating material known in the art. The photoresist 57 includes a photosensitive material that is sensitive to mid-ultraviolet radiation (MUV) or deep-ultraviolet (DUV) radiation as known in the art.

Referring to FIGS. 2A and 2B, the photoresist 57 is lithographically patterned by exposure and development to form a pattern including edge segments therein. The smoothly varying edge segments of the pattern in the photoresist 57 can include straight lines or curves with a constant curvature (e.g., a circle) or a continuously varying curvature (e.g., an ellipse). The pattern in the photoresist 57 is transferred into the ARC layer 52 and the first low-k dielectric material layer 50P, for example, by an anisotropic etch that employs the photoresist 57 as an etch mask. A recess region is formed within the first low-k dielectric material layer 50P, and sidewalls of the first low-k dielectric material layer 50P are exposed in the recess region. The sidewalls of the first low-k dielectric material layer 50P can be vertical, i.e., perpendicular to the exposed surfaces of the metallic layer 42, or can have an insignificant degree of taper. The photoresist 57 is subsequently removed.

Figures 3A, 3B:
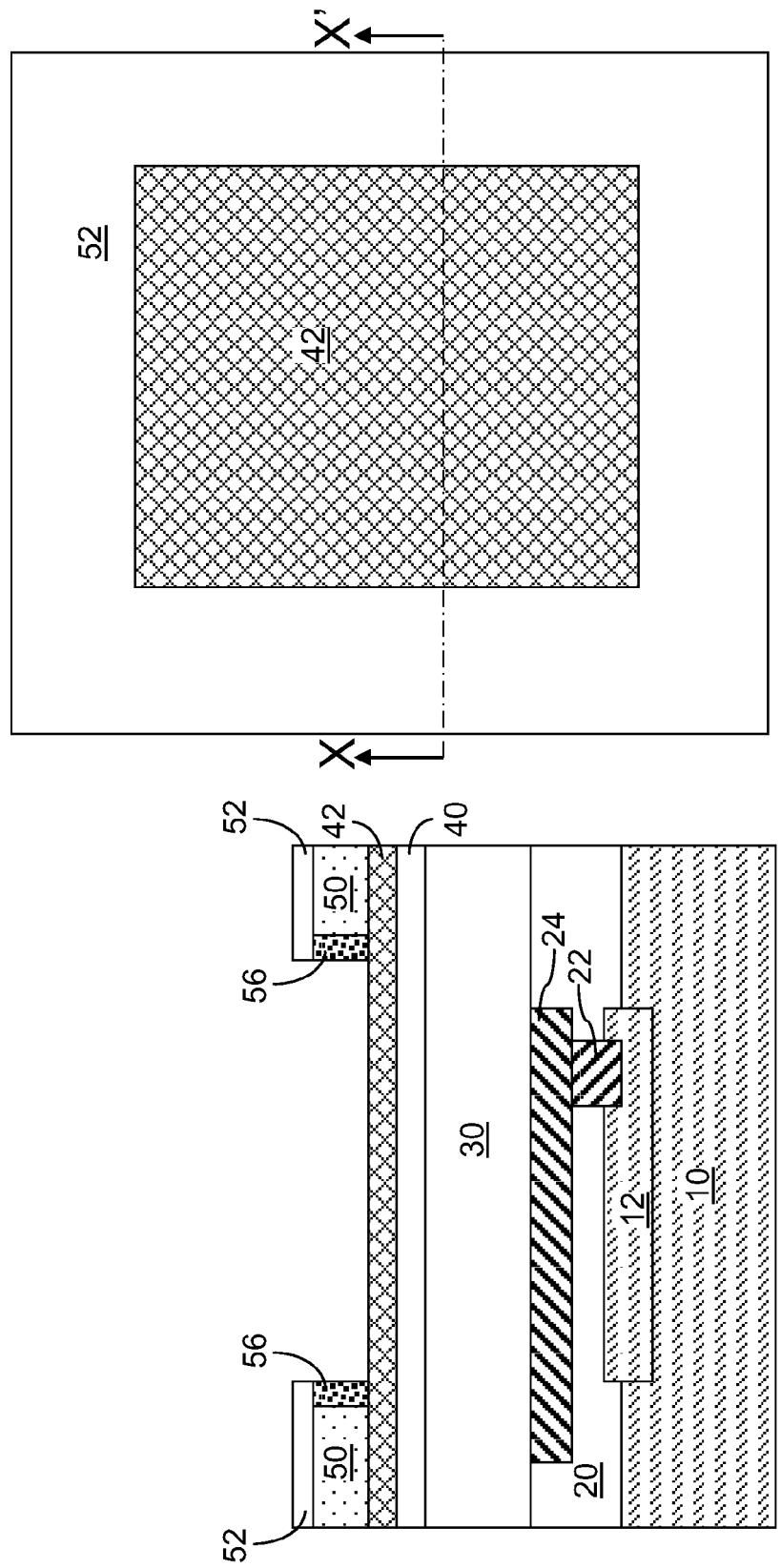
FIGS. 3A and 3B show the first exemplary structure of FIGS. 2A and 2B after removal of the photoresist and formation of a damaged portion of the first low-k dielectric material layer.

Referring to FIGS. 3A and 3B, the sidewalls of the first low-k dielectric material layer 50P is treated with an oxygen-containing plasma or a hydrogen-containing plasma to form a damaged first low-k dielectric material portion 56 on exposed sidewalls of the first low-k dielectric material layer 50P. In other words, a damaged sidewall portion is formed by de-carbonizing a portion of the first low-k dielectric material layer 50 located at the sidewall through the plasma treatment. The first exemplary structure as shown in FIGS. 2A and 2B can be placed in a plasma processing chamber, and exposed surfaces of the first exemplary structure as shown in FIGS. 2A and 2B are subjected to the oxygen-containing plasma or the hydrogen-containing plasma, which causes damages and chemical changes to the material on the sidewalls of the first low-k dielectric material layer 50P. Specifically, the oxygen plasma or the hydrogen plasma removes at least one carbon-containing group from the molecules of the material in the first low-k dielectric material layer 50P near the sidewalls around the recessed region.

The ARC layer 52 protects the first low-k dielectric material layer 50P from plasma damages during the plasma treatment. Thus, the lateral extent of the damaged first low-k dielectric material portion 56 within a certain lateral distance from the initial sidewalls of the first low-k dielectric material layer 50P, which is determined by the type, duration, intensity, and pressure of the plasma, the material composition of the first low-k dielectric material layer 50P, and the temperature of the first low-k dielectric material layer 50P during the plasma treatment. Typically, the plasma has an isotropic component, i.e., the direction of the plasma is not 100% parallel to the initial sidewalls of the first low-k dielectric material layer 50P, but has a component that is not parallel to the initial sidewalls of the first low-k dielectric material layer 50P. In one embodiment, the plasma can be isotropic. In another embodiment, the plasma processing chamber may be configured to provide a type of plasma called a "downstream plasma" in which ionized species are extracted and directed toward the first exemplary structure. The pressure of the plasma can be from 0.01 mTorr to 10 mTorr, although lesser and greater pressures can also be employed. The temperature of the first low-k dielectric material layer 50P during processing can be from 20° C. to 350° C., although lower and higher temperatures can also be employed. The duration and the intensity of the plasma can be selected to set the width of the plasma-damaged portion is from 2 nm to 100 nm, and typically from 5 nm to 50 nm, and preferably from 5 nm to 25 nm.

The damaged portion of the first low-k dielectric material layer 50P, which is herein referred to as a "damaged first low-k dielectric material portion 56," is de-carbonized, i.e., loses carbon atoms. In one embodiment, the damaged portion of the first low-k dielectric material layer 50P can be de-carbonized and de-hydrogenated, i.e., can lose carbon atoms and hydrogen atoms. The damaged first low-k dielectric material portion 56 laterally surrounds the recessed region. The undamaged portion of the first low-k dielectric material layer 50P is herein referred to as an "undamaged first low-k dielectric material portion" 50. The undamaged first low-k dielectric material portion 50 has the same material composition as the first low-k dielectric material layer 50P. However, the damaged first low-k dielectric material portion 56 has a different material composition from the material composition as the first low-k dielectric material layer 50P. Specifically, the undamaged first low-k dielectric material portion 50 includes a first organosilicate glass including Si, C, O, and H, and the damaged first low-k dielectric material portion 56 includes a second organosilicate glass including Si, C, O, and H that is different from the first organosilicate glass such that the atomic concentration of carbon in the second organosilicate glass is less than the atomic concentration of carbon in the first organosilicate glass and the atomic concentration of hydrogen in the second organosilicate glass is less than the atomic concentration of hydrogen in the first organosilicate glass due to the loss of the hydrocarbon groups during the plasma treatment.

The damaged first low-k dielectric material portion 56 has a constant width because lateral extent of the damage caused by the plasma treatment is self-limiting. The constant width can be a "sublithographic dimension," which is less than the smallest printable dimension by optical lithography employing electromagnetic radiation for exposure. While a "lithographic minimum dimension" and a "sublithographic dimension" are defined only in relation to available lithography tools and normally changes from generation to generation of semiconductor technology, it is understood that the lithographic minimum dimension and the sublithographic dimension are to be defined in relation to the best performance of lithography tools available at the time of semiconductor manufacturing. As of the filing date of this application, the lithographic minimum dimension is about 30 nm and is expected to shrink in the future.

Figures 4A, 4B:
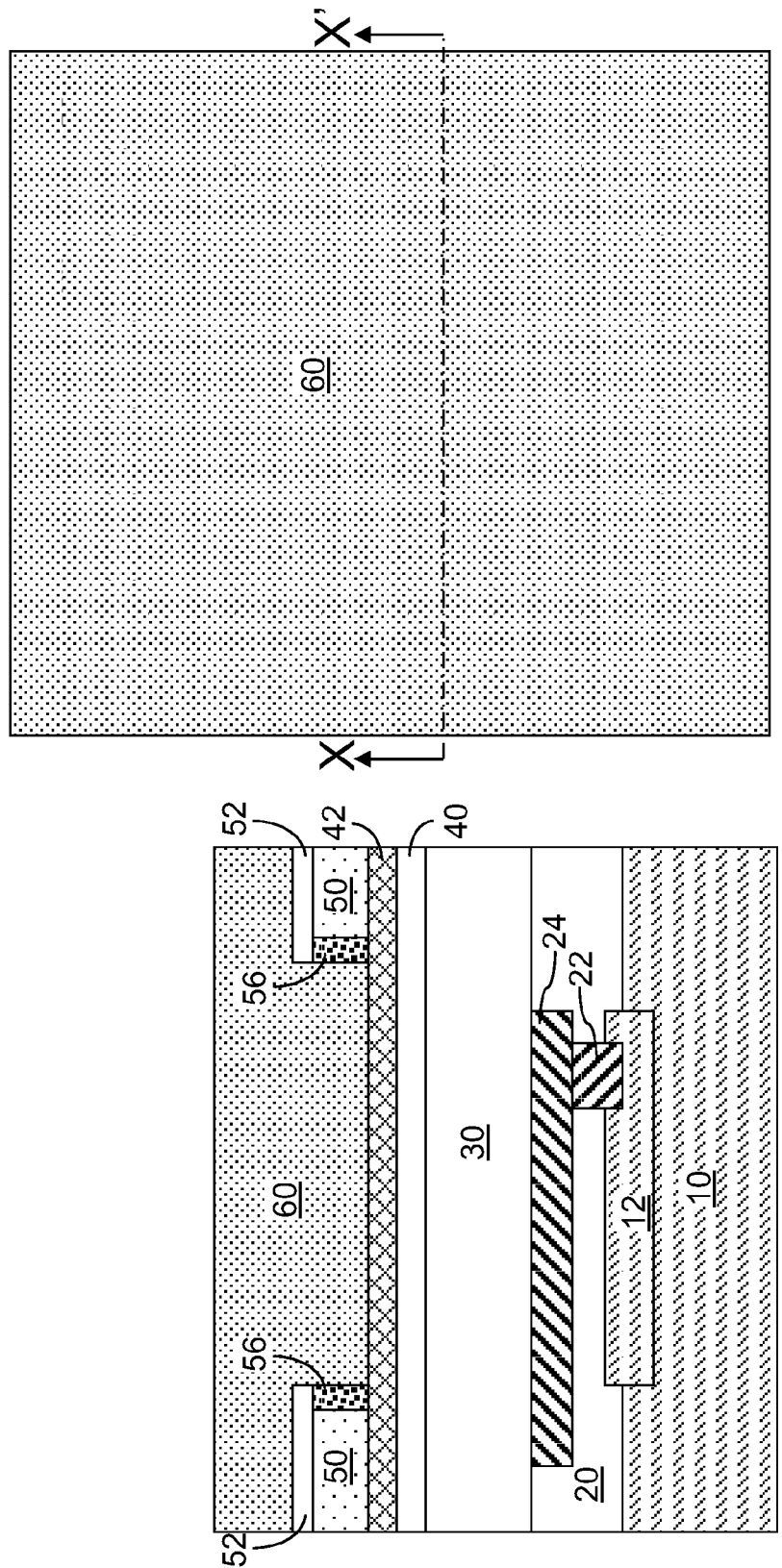
FIGS. 4A and 4B show the first exemplary structure of FIGS. 3A and 3B after formation of a second low-k dielectric material layer that fills a recess region laterally surrounded by the damaged portion of the first low-k dielectric material layer.

Referring to FIGS. 4A and 4B, a second low-k dielectric material layer 60 is deposited in the recessed region and fills the recessed region. The second low-k dielectric material layer 60 includes a material that is more etch resistant than the damaged first low-k dielectric material portion 56 under at least one etch condition. For example, the second low-k dielectric material layer 60 can include methylated-hydrogen silsesquioxane (MSQ) or another organosilicate glass including Si, C, O, and H. In one embodiment, the undamaged first low-k dielectric material portion 50 and the second low-k dielectric material layer 60 have a higher atomic concentration of carbon than the damaged first low-k dielectric material portion 56. The second low-k dielectric material layer 60 can be deposited by a non-self-planarizing deposition method such as chemical vapor deposition (CVD) or by a self-planarizing deposition method such as spin-on coating. The thickness of the second low-k dielectric material layer 60 within the filled recessed region preferably exceeds the combined thickness of the undamaged first low-k dielectric material portion 50 and the ARC layer 52.

Figure 5B:
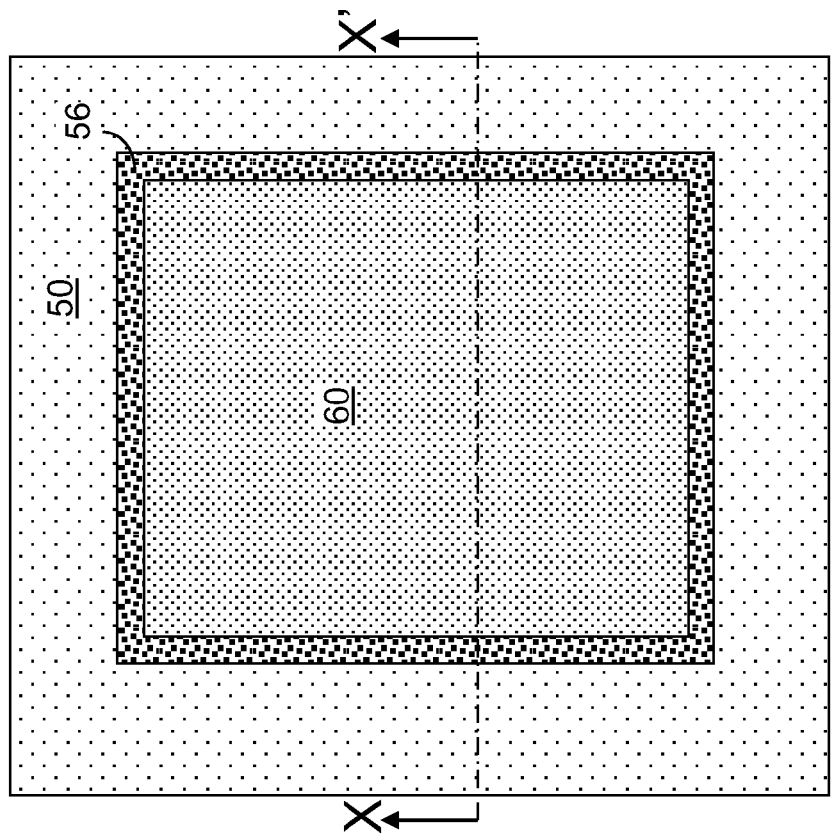
FIGS. 5A and 5B show the first exemplary structure of FIGS. 4A and 4B after recessing and planarizing the second low-k dielectric material layer so that a top surface of the damaged portion of the first low-k dielectric material layer is exposed.
Figure 5A:
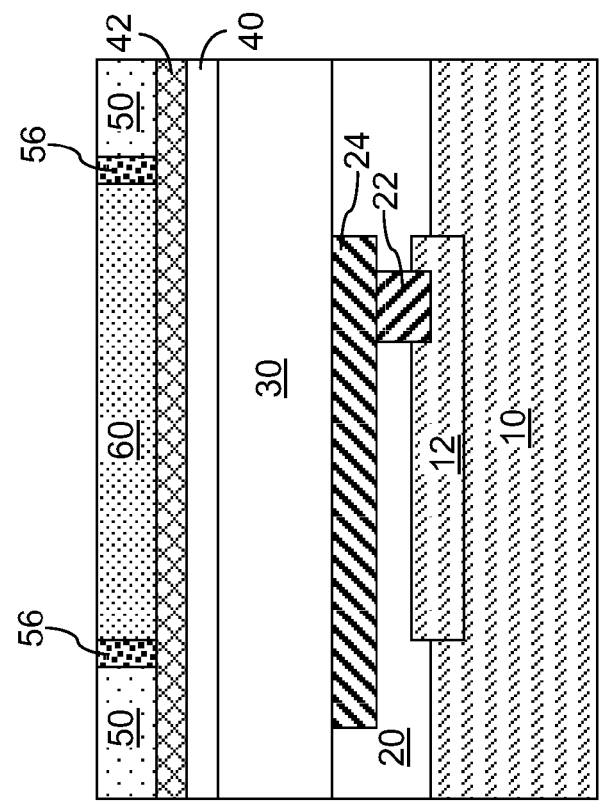

Referring to FIGS. 5A and 5B, the second low-k dielectric material layer 60 is recessed and planarized, for example, by a recess etch, a chemical mechanical planarization, or a combination thereof. After recessing and planarizing the second low-k dielectric material layer 60, the top surfaces of the damaged first low-k dielectric material portion 56 are exposed.

At this step, the first exemplary structure includes at least the metallic layer 42 located on the substrate 10 and a layer contacting the top surface of the metallic layer 42 and including a damaged portion of a first low dielectric constant (low-k) dielectric material layer, i.e., the damaged first low-k dielectric material portion 56, an undamaged portion of the first low-k dielectric material layer, i.e., the undamaged first low-k dielectric material portion 50, and the second low-k dielectric material layer 60. The damaged portion of the first low-k dielectric material layer laterally contacts the undamaged portion of the first low-k dielectric material layer and the second dielectric material layer. The damaged portion of the first low-k dielectric material layer has a lower atomic concentration of carbon than the undamaged portion of the first low-k dielectric material layer.

Referring to FIGS. 6A and 6B, the damaged first low-k dielectric material portion 56 is removed selective to the undamaged first low-k dielectric material portion 50 and the second low-k dielectric material layer 60. The selective removal of the damaged first low-k dielectric material portion 56 can be effected by an anisotropic etch such as a reactive ion etch or an isotropic etch such as a wet etch or a chemical dry etch. The mechanism of the selective removal of the damaged first low-k dielectric material portion 56 can be based on the lower carbon content in the damaged first low-k dielectric material portion 56 relative to the undamaged first low-k dielectric material portion 50 and the second low-k dielectric material layer 60. In a non-limiting example, a wet etch employing hydrofluoric acid can remove the damaged first low-k dielectric material portion 56 faster than the undamaged first low-k dielectric material portion 50 and the second low-k dielectric material layer 60 because the damaged first low-k dielectric material portion 56 behaves more like silicon oxide due to the reduced carbon content. It is noted that hydrofluoric acid is an effective etchant for silicon oxide.

A least one sublithographic width line trench 51, i.e., at least one line trench having a sublithographic width, is formed between the undamaged first low-k dielectric material portion 50 and the second low-k dielectric material layer 60. The shape of the inner periphery of the line cavity 51 coincides with the pattern in the photoresist in FIG. 2B. The line cavity 51 has a constant width, which is the same as the constant width of the damaged first low-k dielectric material portion 56 prior to removal. Thus, the width of the line cavity 51 can be a sublithographic dimension, and can be from 2 nm to 100 nm, and typically from 5 nm to 50 nm, and preferably from 5 nm to 25 nm.

Referring to FIGS. 7A and 7B, a stack of a first optical planarizing layer 70, a first ARC layer 72, and a first photoresist 77 is applied over the line cavity 51, the undamaged first low-k dielectric material portion 50 and the second low-k dielectric material layer 60. The first optical planarizing layer 70 is typically a polymer layer with low viscosity so that the material of the first optical planarizing layer 70 flows to fill recessed regions upon application or deposition. The first optical planarizing layer 70 can employ any material employed for an optical planarizing layer in trilayer lithography methods known in the art. The thickness of the first optical planarizing layer 70 can be from 50 nm to 500 nm, although lesser and greater thicknesses can also be employed. The first ARC layer 72 is a layer of an anti-reflective material known in the art. The thickness of the first photoresist 77 can be from 200 nm to 600 nm, although lesser and greater thicknesses can also be employed. The first photoresist 77 is a layer of a photoresist sensitive to deep-ultraviolet (DUV) radiation or mid-ultraviolet (MUV) radiation as known in the art.

Figures 8A, 8B:
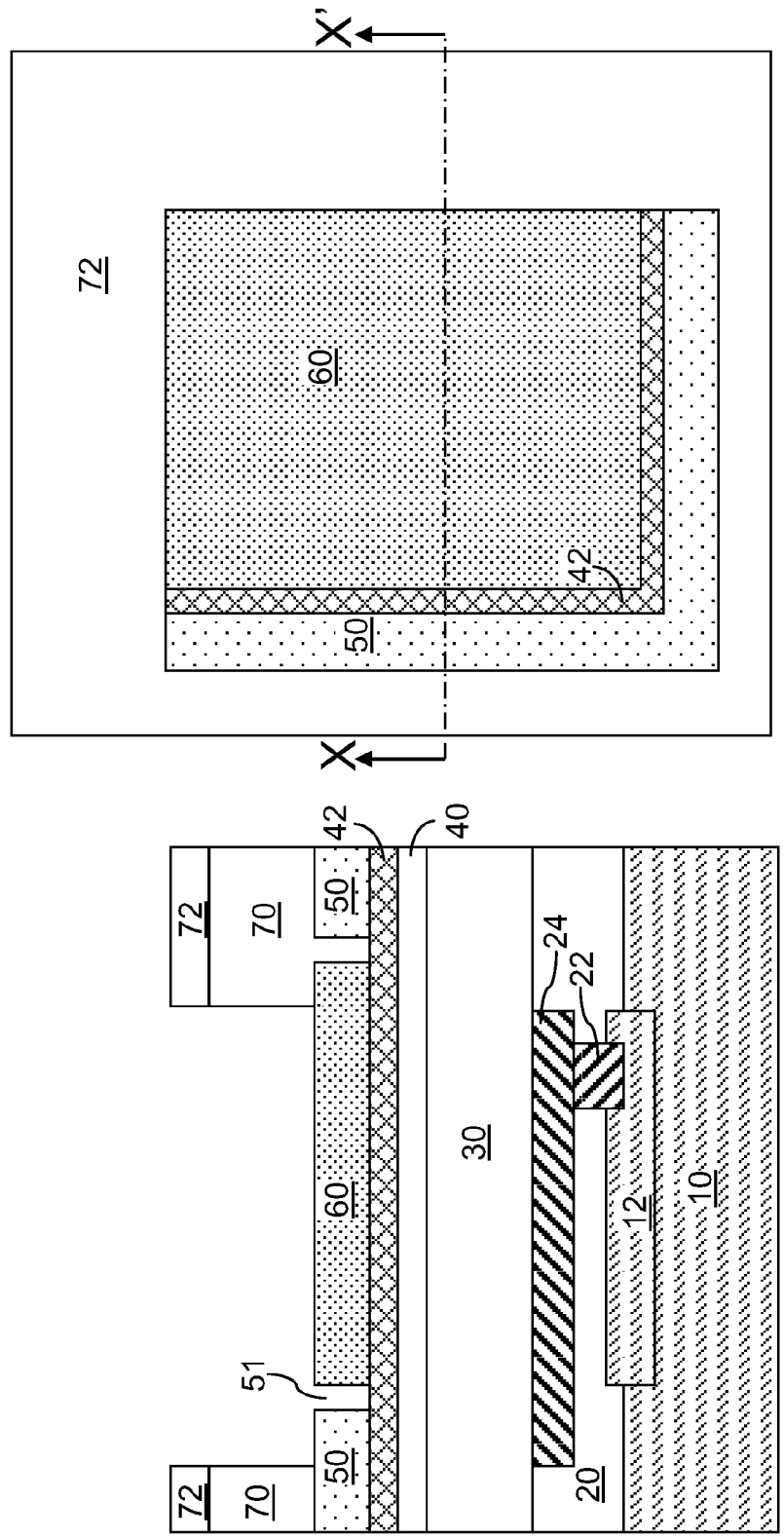
FIGS. 8A and 8B show the first exemplary structure of FIGS. 7A and 7B after transfer of the pattern in the first photoresist into the first ARC layer and the first optical planarizing layer to form a line trench having a composite pattern of an intersection of the pattern in the first photoresist and the pattern of the damaged portion of the first low-k material layer, and removal of the first photoresist.

Referring to FIGS. 8A and 8B, the pattern in the first photoresist 77 is transferred into the first ARC layer 72 and the first optical planarizing layer 70, for example, by an anisotropic etch. The line cavity 51 between the undamaged first low-k dielectric material portion 50 and the second low-k dielectric material layer 60 and within the patterned area, i.e., within the area surrounded by the remaining portions of the first ARC layer 72 and the first optical planarizing layer 70, is re-exposed as the material of the first optical planarizing layer 70 is removed from therein. However, the space between the undamaged first low-k dielectric material portion 50 and the second low-k dielectric material layer 60 and outside the patterned area is filled with the material of the first optically planarizing layer 70. Thus, the line cavity 51 is present only within the patterned area, which is the area of the pattern in the first photoresist 77, at this step. Thus, the pattern of the line cavity 51 at this step is the composite pattern of the intersection of the pattern in the first photoresist 77 as shown in FIG. 7B and the pattern of the damaged first low-k material portion 56 as shown in FIG. 5B. A top surface of the metallic layer 42 is exposed within the area of the composite pattern. The first photoresist 77 can be removed during the pattern transfer etch or after the pattern transfer etch.

Figure 9B:
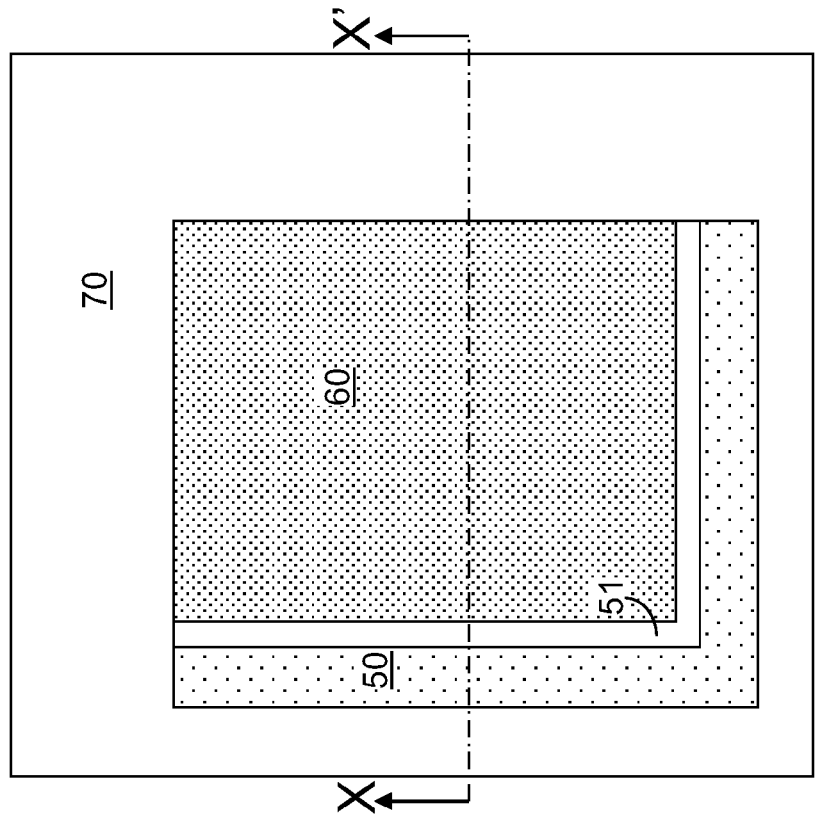
FIGS. 9A and 9B show the first exemplary structure of FIGS. 8A and 8B after transfer of the composite pattern of the line trench into the metallic layer and removal of the first ARC layer.
Figure 9A:
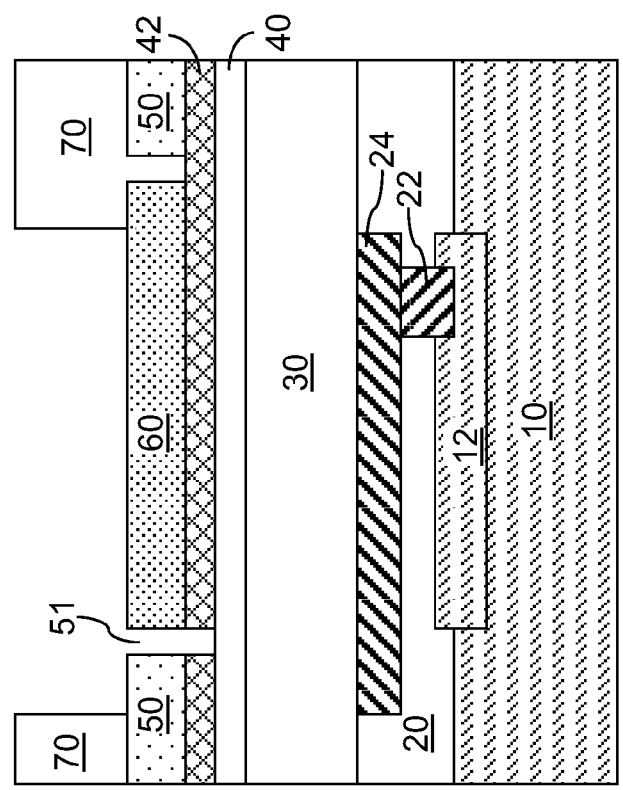

Referring to FIGS. 9A and 9B, the composite pattern in the least one sublithographic width line trench 51 is transferred into the metallic layer 42 employing the combination of the undamaged first low-k dielectric material portion 50, the second low-k dielectric material layer 60, and the first ARC layer 72 as an etch mask. The least one sublithographic width line trench 51 extends to the top surface of the dielectric masking material layer 40, i.e., the top surface of the dielectric masking material layer 40 is exposed at the bottom of the least one sublithographic width line trench 51. The first ARC layer 72 is subsequently removed, for example, by ashing. A trench present in the dielectric masking material layer 40 is a lower portion of the least one sublithographic width line trench 51 and has a constant width. The trench in the dielectric masking material layer 40 has the same area as the upper portion of the least one sublithographic width line trench 51 at the level of the undamaged first low-k dielectric material portion 50 and the second low-k dielectric material layer 60 and bottommost portions of the first optical planarizing layer 70.

Referring to FIGS. 10A and 10B, the first optical planarizing layer 70, the undamaged first low-k dielectric material portion 50, and the second low-k dielectric material layer 60 are removed, for example, by ashing or by exposure to a wet etch chemical that removes the materials of the first optical planarizing layer 70, the undamaged first low-k dielectric material portion 50, and the second low-k dielectric material layer 60 selective to the materials of the metallic layer 42 and the dielectric masking material layer 40. The pattern of the least one sublithographic width line trench 51 in the metallic layer 42 is the composite pattern of the intersection of the pattern in the first photoresist 77 as shown in FIG. 7B and the pattern of the damaged first low-k material portion 56 as shown in FIG. 5B as discussed above. The least one sublithographic width line trench 51 in the metallic layer 42 functions as a mask for any pattern to be subsequently transferred into the interconnect-level dielectric material layer 30. Thus, patterns to be subsequently formed within the interconnect-level dielectric material layer 30 are formed only within subsets of the area of the least one sublithographic width line trench 51 in the metallic layer 42.

Figure 11B:
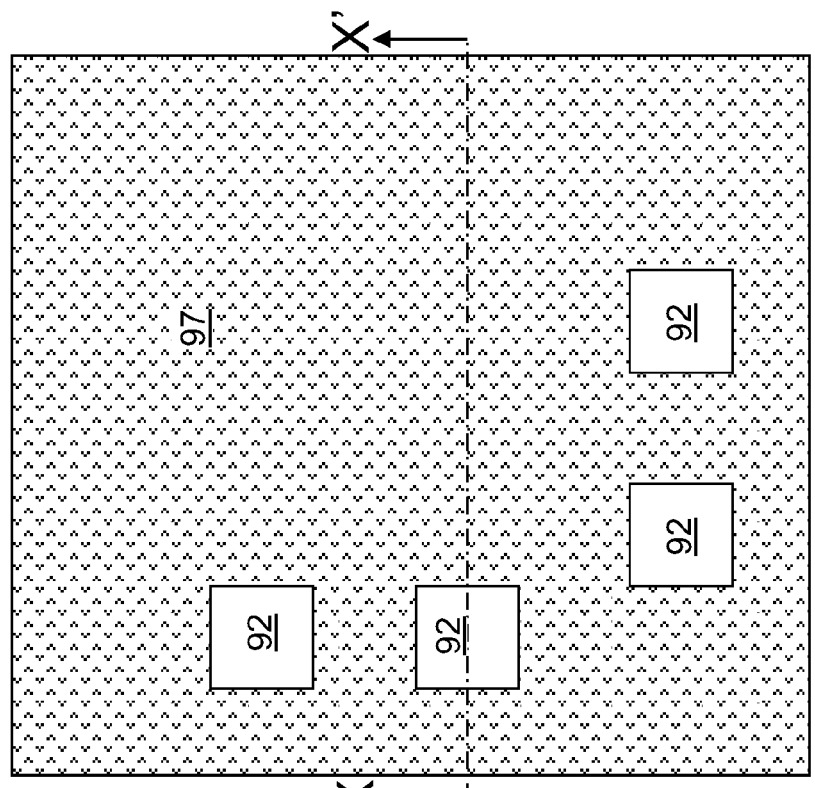
FIGS. 11A and 11B show the first exemplary structure of FIGS. 10A and 10B after depositing a second optical planarizing layer, a second ARC layer, and a second photoresist and lithographic patterning of the second photoresist.
Figure 11A:
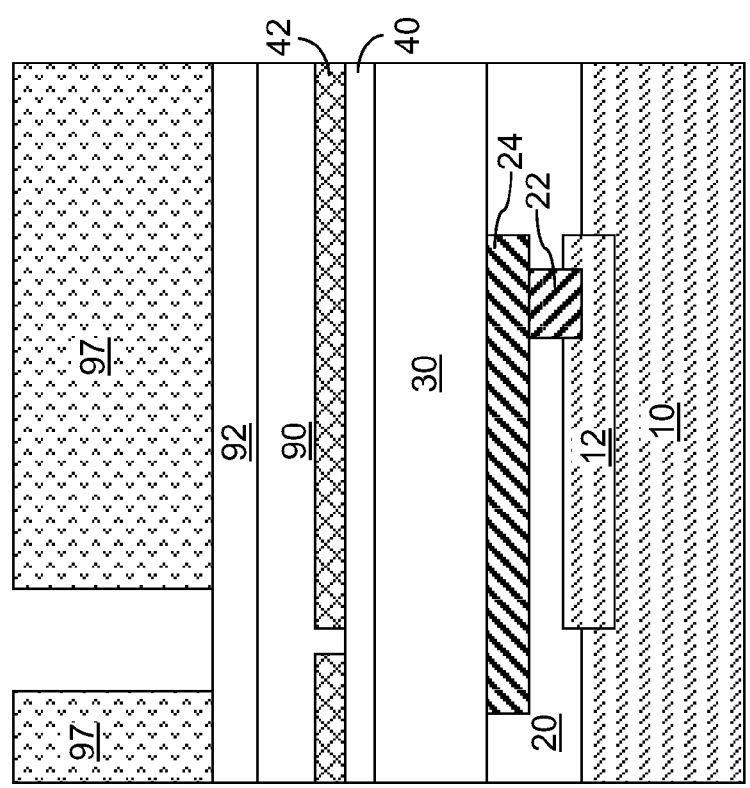

Referring to FIGS. 11A and 11B, a second optical planarizing layer 90, a second ARC layer 92, and a second photoresist 97 are deposited on the exposed surface of the metallic layer 42 and the dielectric masking material layer 40. A pattern is formed in the second photoresist 97 by lithographic exposure and development, and consequently, is a lithographic pattern. For example, the pattern in the second photoresist 97 can include discrete holes located over areas in which via cavities within the interconnect-level dielectric material layer 30 are desired. Each of the discrete holes has lithographic lateral dimensions (e.g., diameter or lateral distance between sidewalls), and is laterally separated from other discrete holes by a distance that is equal to or greater than a critical dimension, i.e., the lithographic minimum dimension.

Figures 12A, 12B:
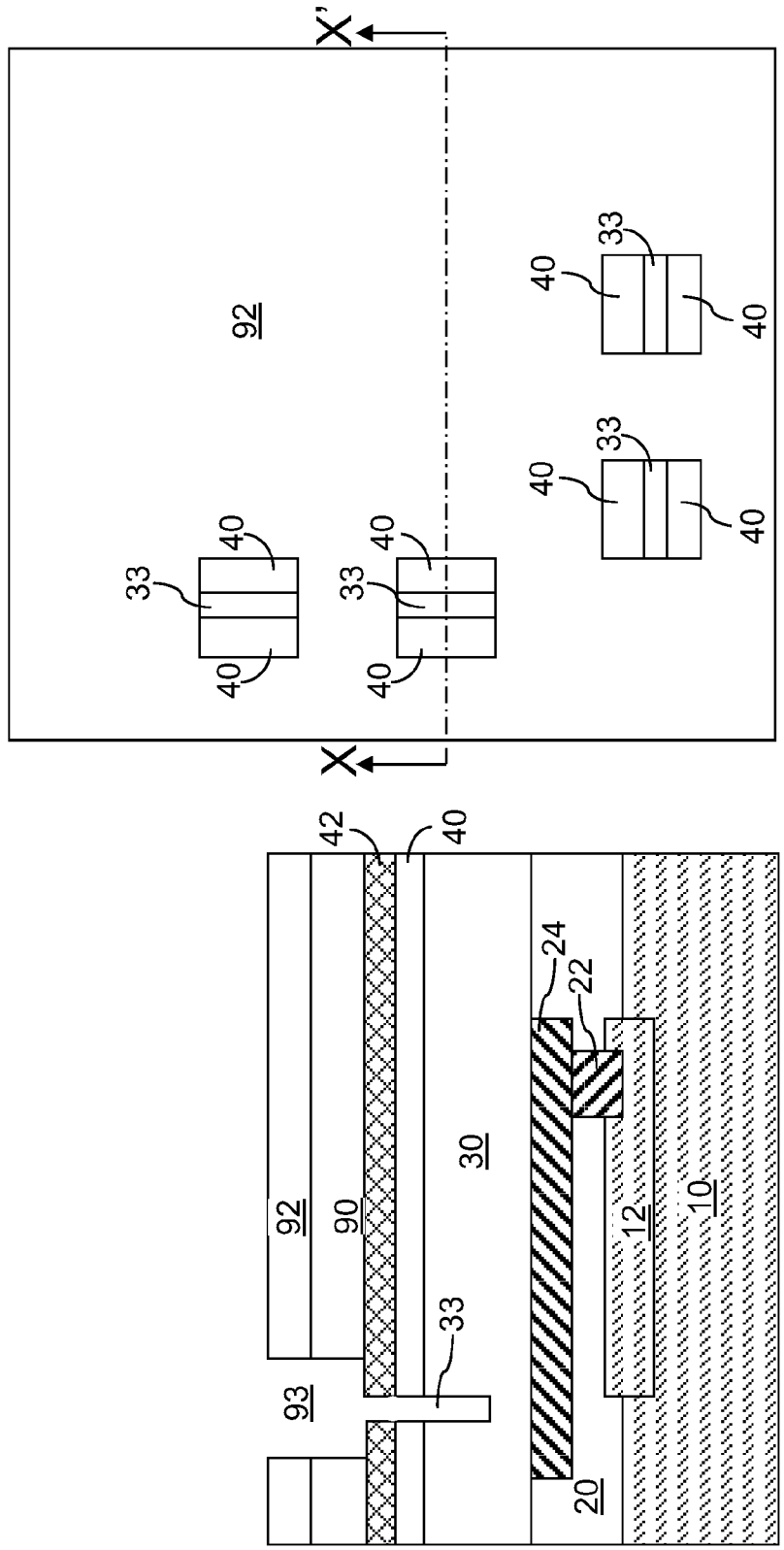
FIGS. 12A and 12B show the first exemplary structure of FIGS. 11A and 11B after transfer of the pattern in the second photoresist into the second ARC layer and the second optical planarizing layer, a subsequent transfer, through the dielectric masking material layer and into an upper portion of the interconnect-level dielectric material layer, of a composite pattern that is an intersection of the pattern in the metallic layer and the pattern in the second ARC layer and the second optical planarizing layer, and removal of the second photoresist.

Referring to FIGS. 12A and 12B, the pattern in the second photoresist 97 is transferred into the second ARC layer 92 and the second optical planarizing layer 90 to form an overlying cavity 93 within the second ARC layer 92 and the second optical planarizing layer 90. A composite pattern, which is an intersection of the pattern of the overlying cavity 93 and the pattern of the line cavity within the metallic layer 42, is transferred through the dielectric masking material layer 40 and into an upper portion of the interconnect-level dielectric material layer 30 by an anisotropic etch. The exposed portion of the metallic layer 42 and the second photoresist 97 (or the second ARC layer 92 if the second photoresist 97 is consumed before the completion of the pattern transfer into the interconnect-level dielectric material layer 30) are employed as the etch mask during the transfer of the composite pattern into the interconnect-level dielectric material layer 30.

At least one via hole 33 is formed in the interconnect-level dielectric material layer 30. The area of each via hole 33 within the interconnect-level dielectric material layer 30 is an intersection of the area of the least one sublithographic width line trench 51 within the metallic layer 42 and an overlying cavity 93 within the second ARC layer 92 and the second optical planarizing layer 90. In other words, each pattern of the at least one via hole 33 is a composite pattern that is an intersection of the pattern in the metallic layer 42 and the pattern in the second ARC layer 92 and the second optical planarizing layer 90. Thus, each area of a via hole 33 is a subset of the entire area of the least one sublithographic width line trench 51 in the metallic layer 42. Any remaining portion of the second photoresist 97 is subsequently removed. Consequently, each etched area of the interconnect-level dielectric material layer 30 can be less than an entire area of the least one sublithographic width line trench 51 in the patterned metallic layer 42. The second ARC layer 92 and the second optical planarizing layer 90 are subsequently removed, for example, by ashing.

Figures 13A, 13B:
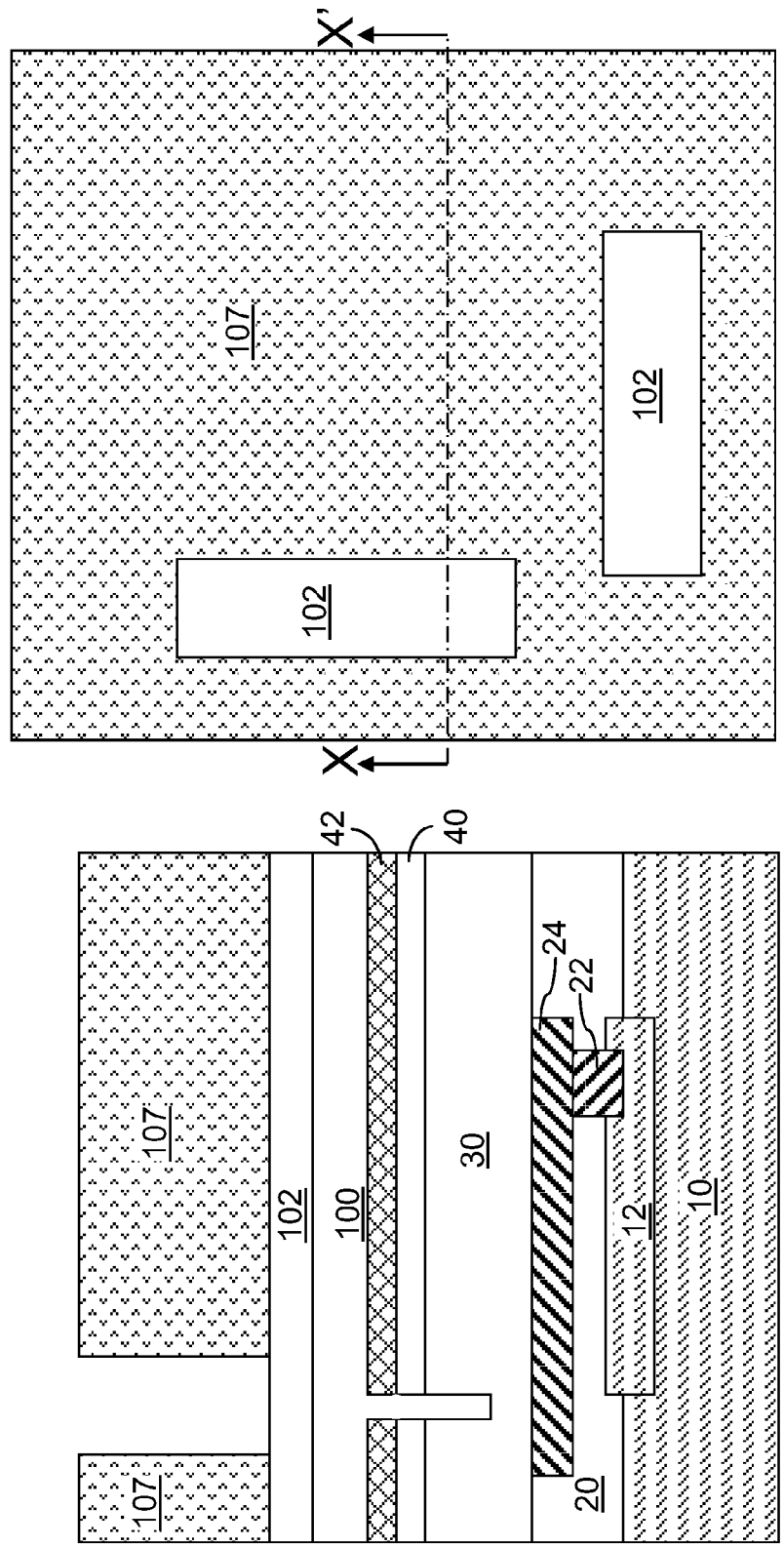
FIGS. 13A and 13B show the first exemplary structure of FIGS. 12A and 12B after depositing a third optical planarizing layer, a third ARC layer, and a third photoresist and lithographic patterning of the third photoresist.
Figure 14D:
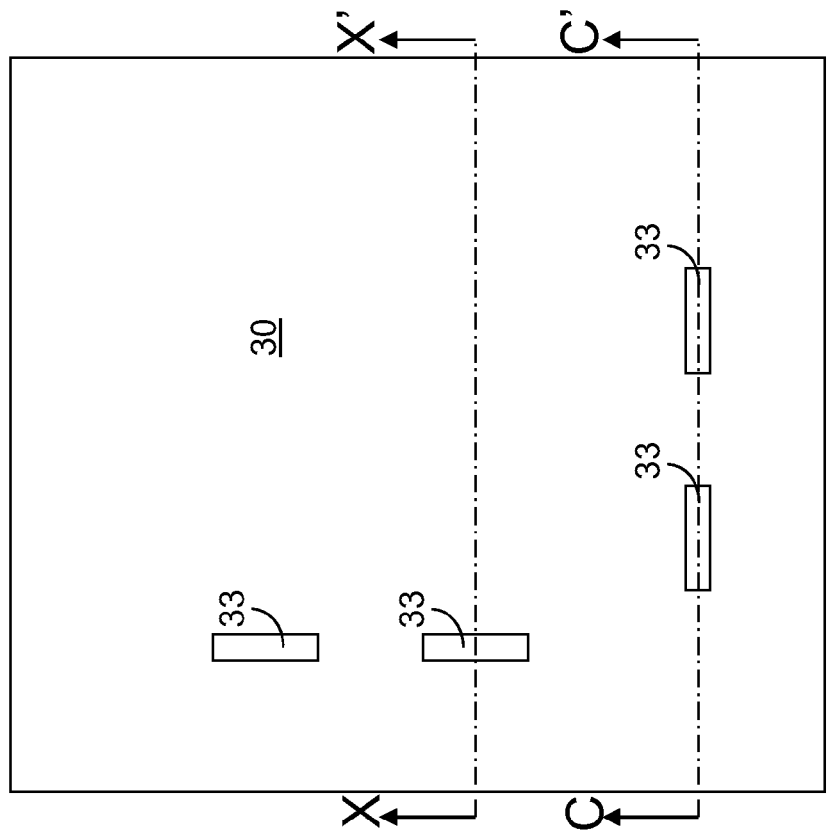
Figure 14C:
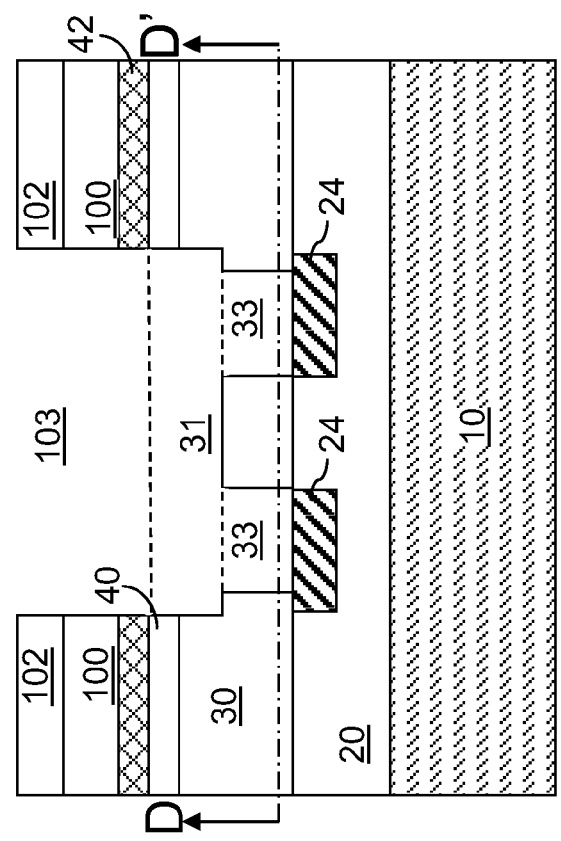
Figure 15D:
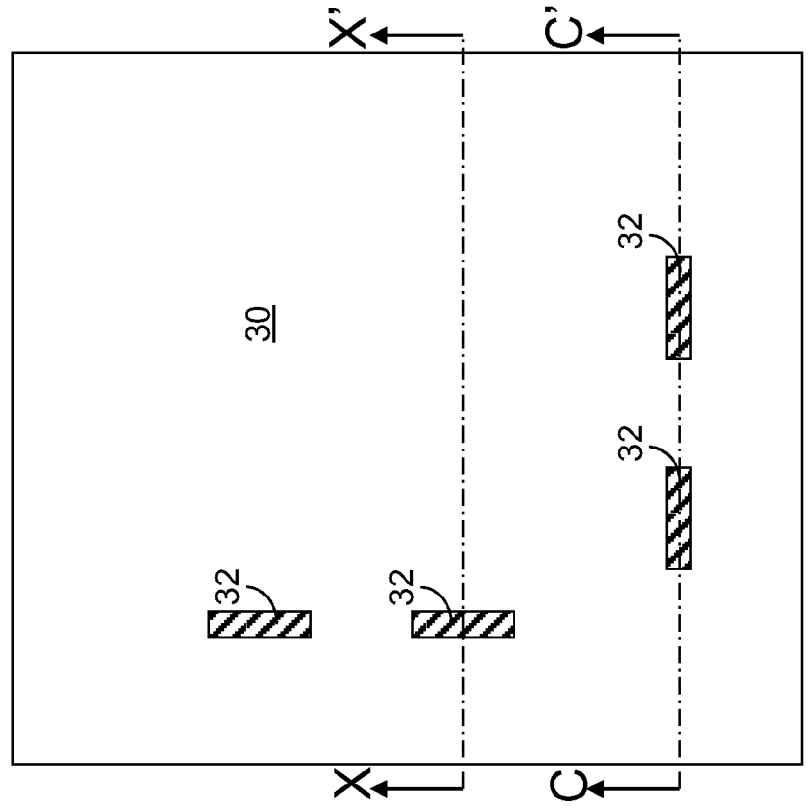
Figure 15C:
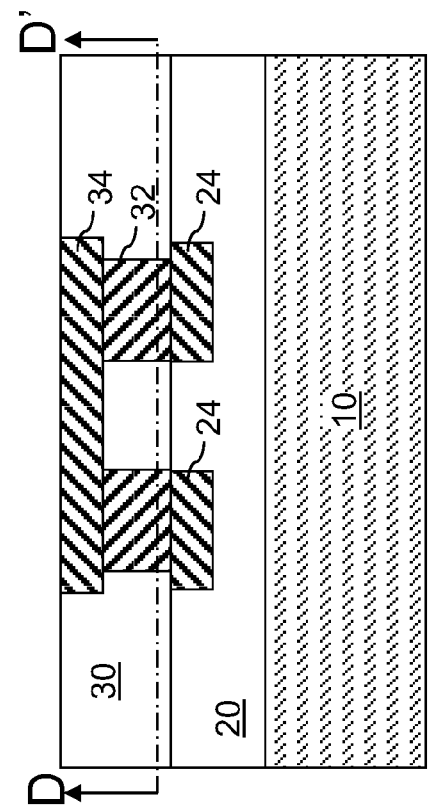

Referring to FIGS. 13A and 13B, a third optical planarizing layer 100, a third ARC layer 102, and a third photoresist 107 are deposited on the exposed surface of the metallic layer 42 and the dielectric masking material layer 40. The third optical planarizing layer 100 fills the at least one via hole 33 in the interconnect-level dielectric material layer either fully or partially (with some cavities therein). A pattern is formed in the third photoresist 107 by lithographic exposure and development, and consequently, is a lithographic pattern. For example, the pattern in the third photoresist 107 can include line trenches located over areas in which line trenches within the interconnect-level dielectric material layer 30 are desired. If multiple line trench patterns are present in the third photoresist 107, each of the line trenches is laterally separated from other line trenches by a distance that is equal to or greater than a critical dimension, i.e., the lithographic minimum dimension.

Referring to FIGS. 14A, 14B, 14C, and 14D, the pattern in the third photoresist 107 is transferred into the third ARC layer 102 and the third optical planarizing layer 100 to form an overlying cavity 103 within the third ARC layer 102 and the third optical planarizing layer 100. A composite pattern, which is an intersection of the pattern of the overlying cavity 103 and the pattern of the line cavity within the metallic layer 42, is transferred through the dielectric masking material layer 40 and into an upper portion of the interconnect-level dielectric material layer 30 by an anisotropic etch. The pre-existing pattern of the at least one via hole 33 within the interconnect-level dielectric material layer 30 is further extended downward so that top surfaces of the at least one conductive line structure 24 and/or other conductive or semiconducting structures are exposed at the bottom of the at least one via hole 33. The exposed portion of the metallic layer 42 and the third photoresist 107 (or the third ARC layer 102 if the third photoresist 107 is consumed before the completion of the pattern transfer into the interconnect-level dielectric material layer 30) are employed as the etch mask during the transfer of the composite pattern into the interconnect-level dielectric material layer 30.

At least one line cavity 31 is formed in the upper portion of the interconnect-level dielectric material layer 30. The area of each of the at least one line cavity 31 within the interconnect-level dielectric material layer 30 is an intersection of the area of the least one sublithographic width line trench 51 within the metallic layer 42 and an overlying cavity 103 within the third ARC layer 102 and the third optical planarizing layer 100. In other words, each pattern of the at least one line cavity 31 is a composite pattern that is an intersection of the pattern in the metallic layer 42 and the pattern in the third ARC layer 102 and the third optical planarizing layer 100. Thus, each area of the at least one line cavity 31 is a subset of the entire area of the least one sublithographic width line trench 51 in the metallic layer 42. Any remaining portion of the third photoresist 107 is subsequently removed. Consequently, each etched area of the interconnect-level dielectric material layer 30 can be less than an entire area of the least one sublithographic width line trench 51 in the patterned metallic layer 42. The third ARC layer 102 and the third optical planarizing layer 100 are subsequently removed, for example, by ashing.

In general, a plurality of photoresists can be employed to form a composite patterned structure including at least one via hole 33 and at least one line cavity 31. A photoresist can define an area, a subset of which is transferred into the interconnect-level dielectric material layer 30 to define an etched area in the interconnect-level dielectric material layer 30. Another photoresist can define another area, a subset of which is transferred into the interconnect-level dielectric material layer 30 to define another etched area in the interconnect-level dielectric material layer 30. One of the etched area of the interconnect-level dielectric material layer 30 and the other etched area of the interconnect-level dielectric material layer 30 can be an area of via cavities, i.e., via holes, and the other of the etched area of the interconnect-level dielectric material layer 30 and the other etched area of the interconnect-level dielectric material layer 30 can be an area of a line cavity. The area of each line cavity within the interconnect-level dielectric material layer 30 can include the area of at least one of the via cavities within the interconnect-level dielectric material layer 30. Each etched area is a subset of the entire area of the line cavity within the metallic layer 42. The order of the patterning of the via cavities and the patterning of the line cavities can be reversed.

Referring to FIGS. 15A, 15B, 15C, and 15D, a conductive material such as a metal is deposited within the etched areas of the interconnect-level dielectric material layer 30, i.e., within the at least one via hole 33 and at least one line cavity 31, for example, by physical vapor deposition (PVD), electroplating, chemical vapor deposition (CVD), or a combination thereof. The conductive material is then planarized, for example, by a recess etch, chemical mechanical planarization (CMP), or a combination thereof. The stack of the dielectric masking material layer 40 and the metallic layer 42 can be removed either before the deposition of the conductive material or after the planarization of the conductive material. At the end of the planarization and the removal of the dielectric masking material layer 40 and the metallic layer 42, at least one metal interconnect structure is formed as embedded structures within the interconnect-level dielectric material layer 30. Each metal interconnect structure can include a conductive line structure 34 and at least one conductive via structure 32. The topmost surface of the at least one conductive line structure 34 is coplanar with the topmost surface of the interconnect-level dielectric material layer 30. The entirety of the at least one metal interconnect structure (32, 34) has a constant width, which can be a sublithographic dimension.

Referring to FIGS. 16A and 16B, additional interconnect level dielectric material layer, which is herein referred to as at least one overlying-level dielectric material layer 130, can be formed above the interconnect-level dielectric material layer 30 and the at least one metal interconnect structure (32, 34) embedded therein. At least another metal interconnect structure can be formed in the overlying-level dielectric material layer 130, which may be formed by repetitively applying processing steps described above, or alternatively, by applying conventional methods for forming conventional metal interconnect structures. Each of the at least another metal interconnect structure can include a conductive line structure 134 and at least one conductive via structure 132.

Figure 17B:
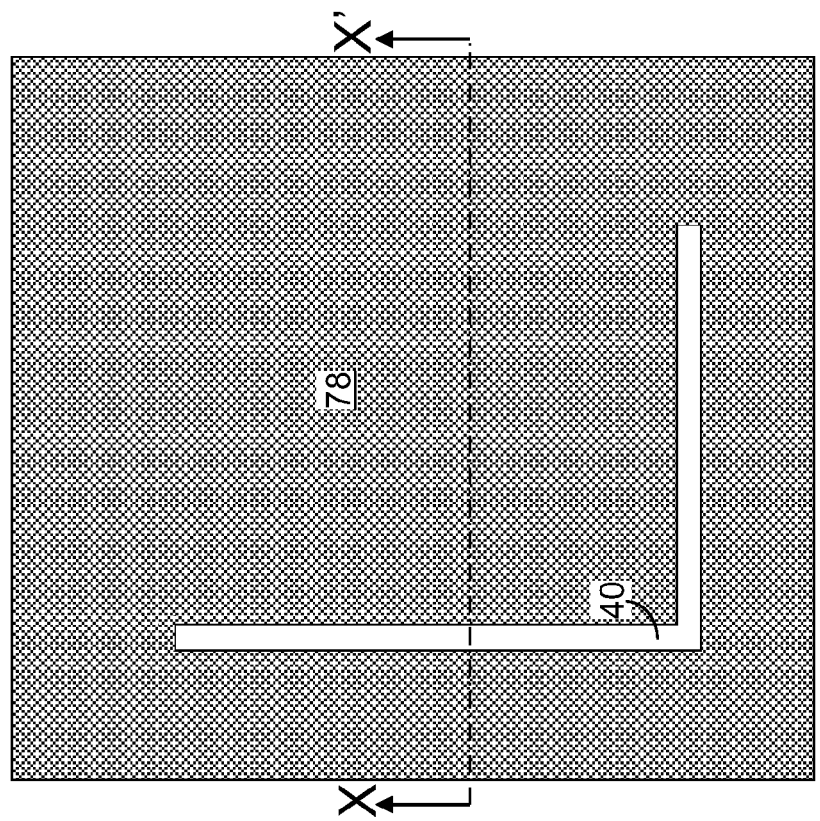
FIGS. 17A and 17B show a second exemplary structure, which can be derived from the first exemplary structure of FIGS. 9A and 9B by removing the first optical planarizing layer and converting the undamaged portion of the first low-k material layer and the second low-k dielectric material layer into a silicon-oxide-containing layer.
Figure 17A:
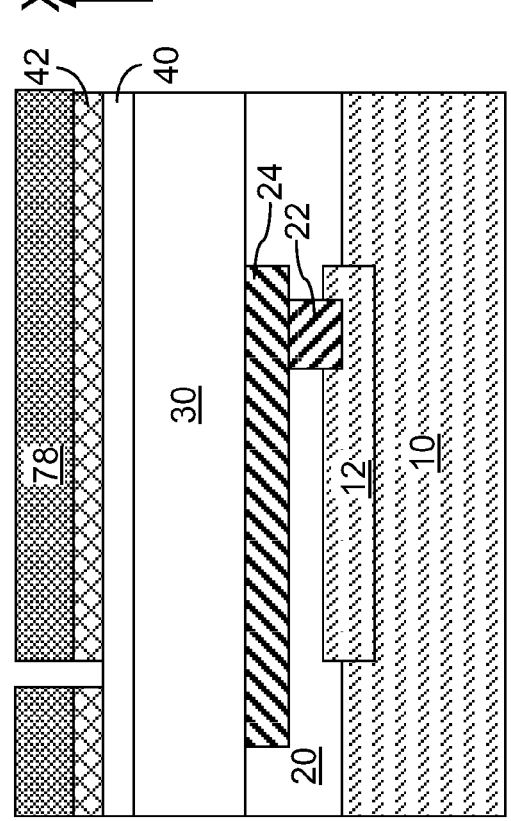

Referring to FIGS. 17A and 17B, a second exemplary structure can be derived from the first exemplary structure of FIGS. 9A and 9B by removing the first optical planarizing layer 70 and converting the undamaged first low-k material portion 50 and the second low-k dielectric material layer 60 into a silicon-oxide-containing layer 78. The conversion of the undamaged first low-k material portion 50 and the second low-k dielectric material layer 60 into the silicon-oxide-containing layer 78 can be effected, for example, by subjecting the undamaged first low-k material portion 50 and the second low-k dielectric material layer 60 to a hydrogen plasma or to an oxygen plasma, which removes carbon-containing groups from the undamaged first low-k material portion 50 and the second low-k dielectric material layer 60. The carbon-containing groups can be, but are not limited to, a methyl group ($—CH_3$) and an ethyl group ($—C_2H_5$). With the loss of carbon atoms, and typically, with the loss of hydrocarbon groups, the silicon-oxide-containing layer 78 is chemically more like low density silicon oxide than original organosilicate glass. Due to the structural damage and inherent porosity in the silicon-oxide-containing layer 78, however, the silicon-oxide-containing layer 78 has a higher etch rate in hydrofluoric acid than normal silicon oxide, which may be employed in the dielectric masking material layer 40.

Figure 18B:
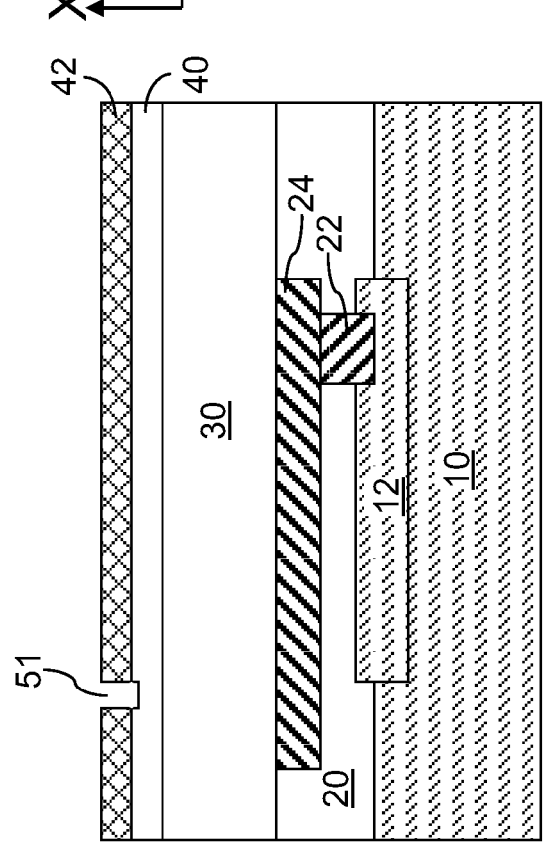
FIGS. 18A and 18B show the second exemplary structure of FIGS. 17A and 17B after removal of the silicon-oxide-containing layer, which may form a divot in the dielectric masking material layer.
Figure 18A:
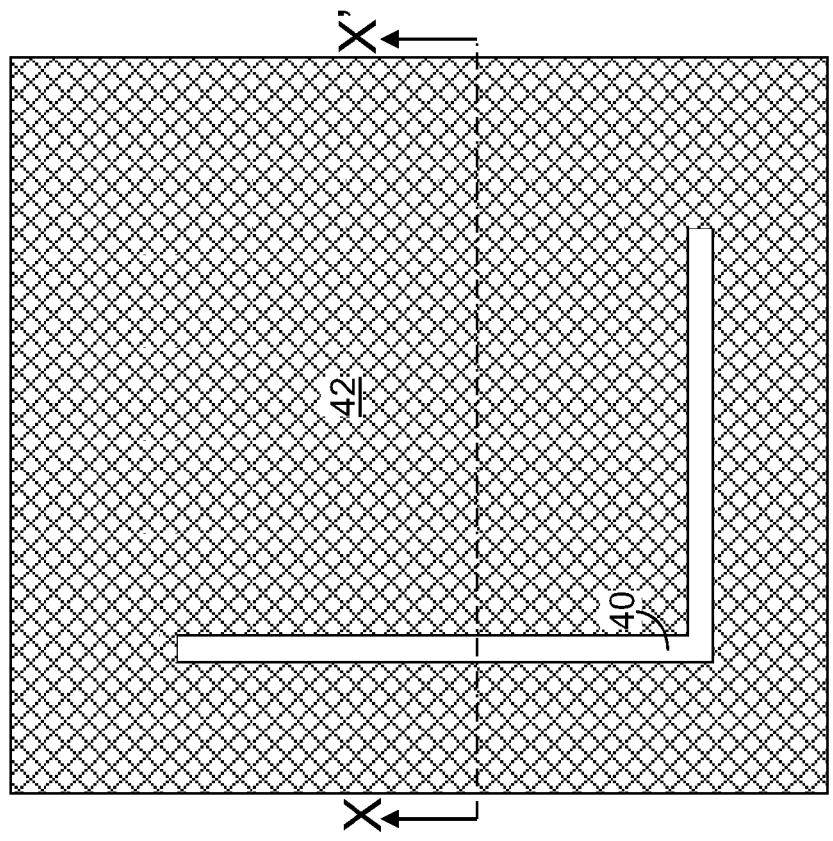

Referring to FIGS. 18A and 18B, the silicon-oxide-containing layer 78 is removed selective to the metallic layer 42. In one embodiment, the material of the dielectric masking material layer 40 is immune to the etch chemistry employed to remove the silicon-oxide-containing layer 78, and the surfaces of the dielectric masking material layer 40 can be unaffected by the etch chemistry employed to remove the silicon-oxide-containing layer 78. In another embodiment, the material of the dielectric masking material layer 40 may be susceptible to the etch chemistry to a lesser degree than the material of the silicon-oxide-containing layer 78 is. In this case, a divot may be formed on the surface of the dielectric masking material layer 40 directly underneath the least one sublithographic width line trench 51 within the metallic layer 42, i.e., directly underneath the pattern in the metallic layer 42, as an upper portion of the dielectric masking material layer 40 is removed during removal of the silicon-oxide-containing layer 78.

Referring to FIGS. 19A and 19B, a stack of a line-level optical planarizing layer 80, a line-level ARC layer 82, and a line-level photoresist 87 are applied on the metallic layer 42. The line-level optical planarizing layer 80 fills the line cavity in the metallic layer 42. The line-level photoresist 87 is lithographically patterned, for example, by lithographic exposure and development, to define a line-level pattern. At least one line shaped trench is formed within the line-level photoresist 87. The line-level photoresist 87 can be employed to define an additional area in which metal lines having lithographic widths are to be subsequently formed in the interconnect-level dielectric material layer 30.

Figures 20A, 20B:
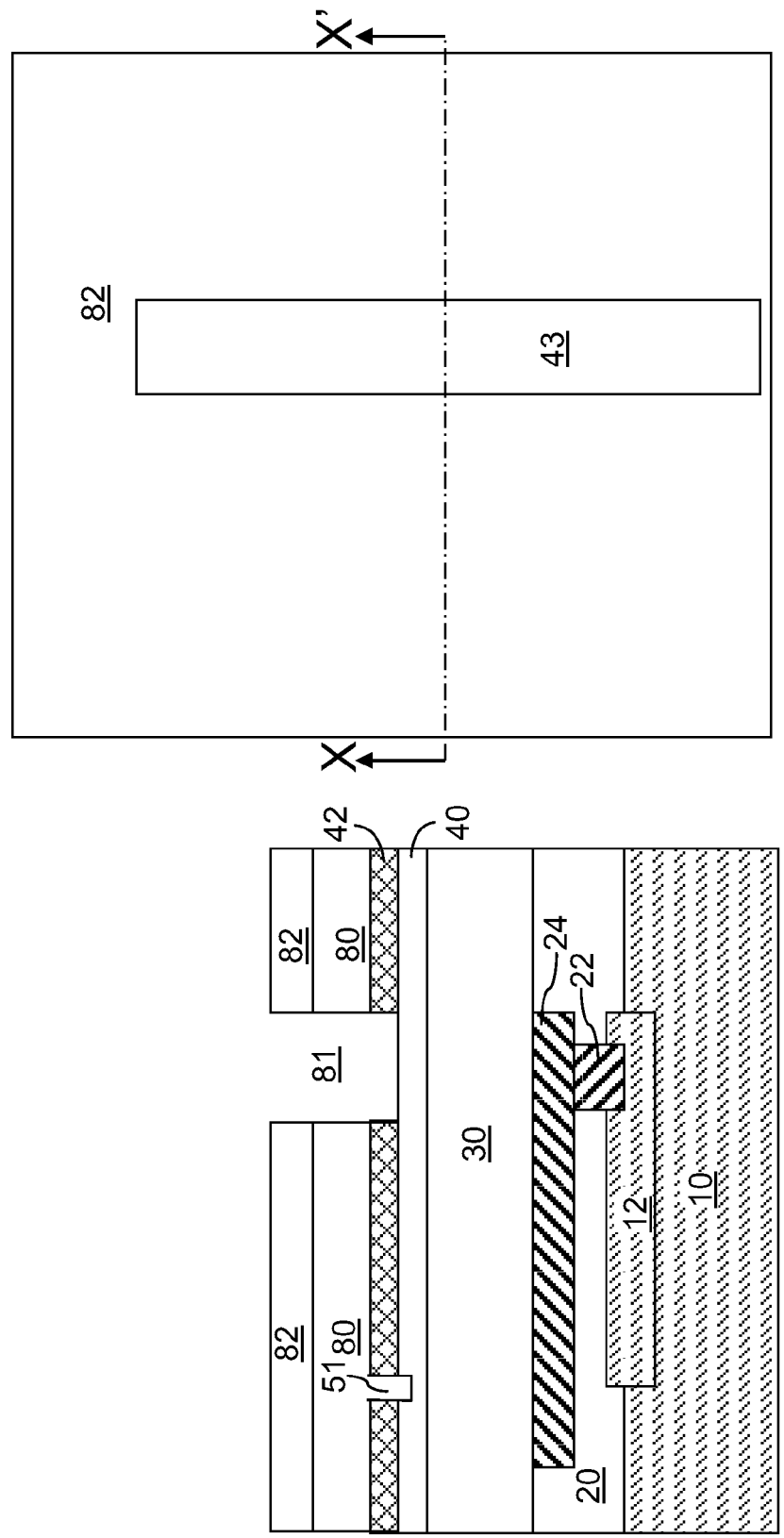
FIGS. 20A and 20B show the second exemplary structure of FIGS. 19A and 19B after transfer of the pattern, i.e., a line-level pattern, in the line-level photoresist into the line-level ARC layer, the line-level optical planarizing layer, and the metallic layer and a simultaneous transfer of a preexisting pattern in the metallic layer into the dielectric masking material layer, and a subsequent removal of the line-level photoresist. The pattern in the dielectric masking material layer is a composite pattern that is an intersection of the pattern in the patterned metallic layer and the pattern in the line-level ARC layer and the line-level optical planarizing layer.

Referring to FIGS. 20A and 20B, the line-level pattern in the line-level photoresist 87 is transferred into the line-level ARC layer 82, the line-level optical planarizing layer 80, and the metallic layer 42, for example, by at least one anisotropic etch. At least one lithographic width line trench 41, i.e., at least one line trench having a lithographic width, is formed within the metallic layer 42 to add a pattern to the metallic layer in addition to the pattern defined by the at least one sublithographic width line trench 51 within the metallic layer 42. Thus, a composite pattern that is a union, i.e., the Boolean sum, of the pattern of the least one sublithographic width line trench 51 and the at least one lithographic width line trench 41 is formed in the metallic layer 42. The line-level photoresist 87 can be removed during the pattern transfer from the line-level photoresist 87 into the metallic layer 42.

Referring to FIGS. 21A and 21B, the line-level ARC layer 82 and the line-level optical planarizing layer 80 are removed selective to the metallic layer 42, for example, by ashing.

Referring to FIGS. 22A and 22B, a via-level optical planarizing layer 110, a via-level ARC layer 112, and a via-level photoresist 117 are deposited on the exposed surface of the metallic layer 42 and the dielectric masking material layer 40. A pattern is formed in the via-level photoresist 117 by lithographic exposure and development in the same manner as in the processing steps of FIGS. 13A and 13B to define at least one via hole regions, which are located in areas in which at least one via structure is to be subsequently formed in a lower portion of the interconnect-level dielectric material layer 30.

The openings in the via-level photoresist 117 have lithographic dimensions. In one embodiment, at least one opening in the pattern of the via-level photoresist 107 straddles over the at least one sublithographic width line trench 51. In another embodiment, at least one opening in the pattern of the via-level photoresist 107 is located within an area of the at least one lithographic width line trench 41. In yet another embodiment, the at least one opening in the pattern of the via-level photoresist 107 is straddles over a portion of the at least one sublithographic width line trench 51 and an adjacent portion of the at least one lithographic width line trench 41.

Referring to FIGS. 23A and 23B, the pattern in the via-level photoresist 117 is transferred into the via-level ARC layer 112 and the via-level optical planarizing layer 110 to form at least one overlying cavity 113 within the via-level ARC layer 112 and the via-level optical planarizing layer 110. Portions of the at least one sublithographic width line trench 51 and the at least one lithographic width line trench 41 underlying the at least one overlying cavity 113 are exposed.

Portions of the top surface of the dielectric masking material layer 40 are exposed in areas that are common to the pattern of the at least one overlying cavity and the pattern in the metallic layer 42, i.e., the pattern that is a union of a first pattern including the at least one sublithographic width line trench 51 and a second pattern including the at least one lithographic width line trench 41. A composite pattern, which is an intersection of the pattern of the overlying cavity 113 and the pattern in the metallic layer 42, is transferred through the dielectric masking material layer 40 and into an upper portion of the interconnect-level dielectric material layer 30 by an anisotropic etch.

Various types via holes can be formed in the upper portion of the interconnect-level dielectric material layer 40 and the dielectric masking material layer 40. The various types of via holes can include at least one first via hole 133, at least one second via hole 43, and/or at least one third via hole 53. The at least one first via hole 133 has a sublithographic width, and is located in at least one area that is an intersection of an overlying cavity 113 and a portion of the at least one sublithographic width line trench 51. The at least one second via hole 43 has a lithographic width, and is located in at least one area that is an intersection of an overlying cavity 113 and a portion of the at least one lithographic width line trench 41. The at least one third via hole 53 include a portion having a lithographic width and an adjoining portion having a sublithographic width, and is located in at least one area that is an intersection of an overlying cavity 113 and a region in which one of the at least one sublithographic width line trench 51 adjoins one of the at least one lithographic width line trench 41.

Figures 24A, 24B:
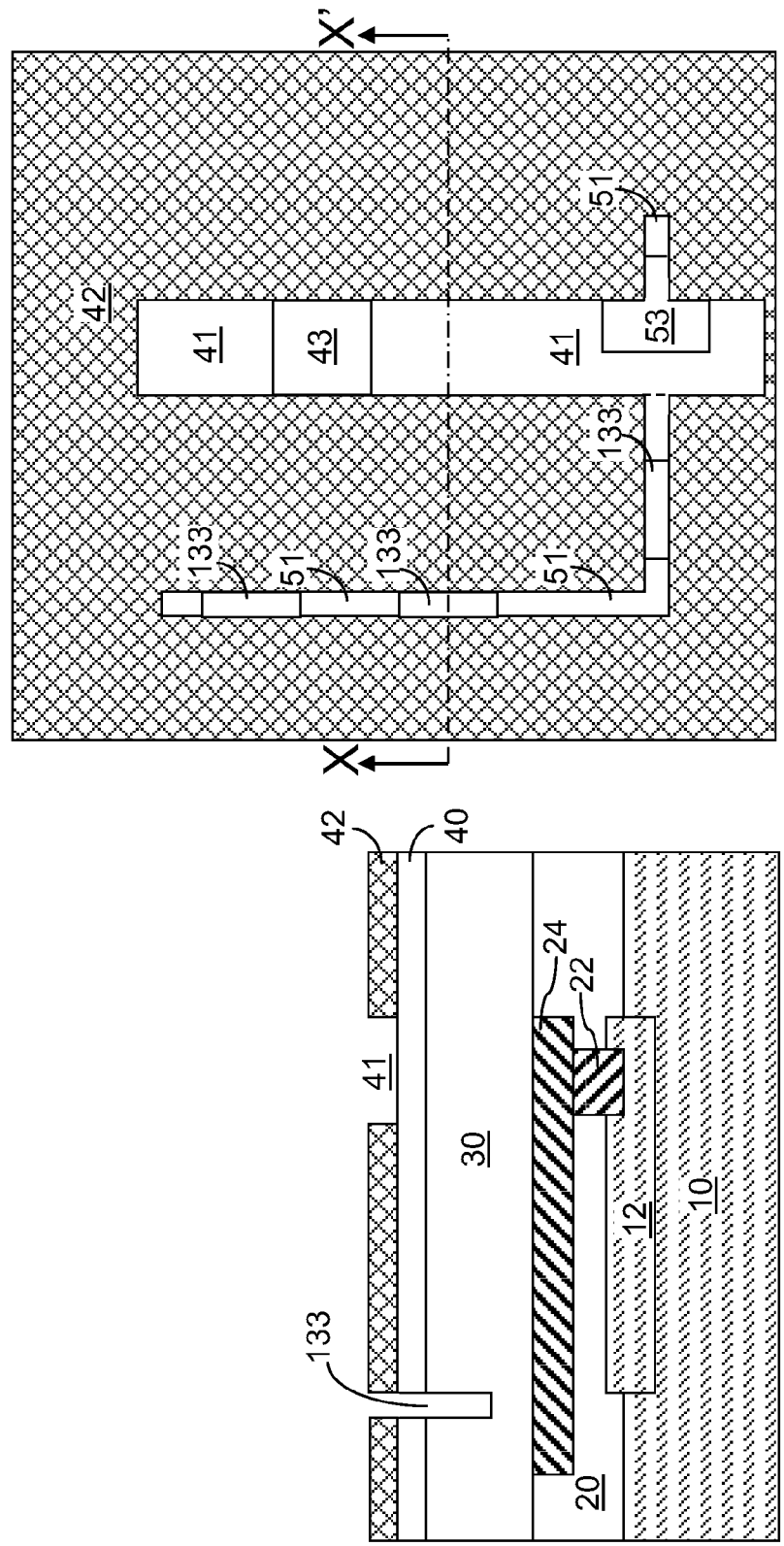
FIGS. 24A and 24B show the second exemplary structure of FIGS. 23A and 23B after removal of the via-level ARC layer and the via-level optical planarizing layer selective to the metallic layer.
Figure 25B:
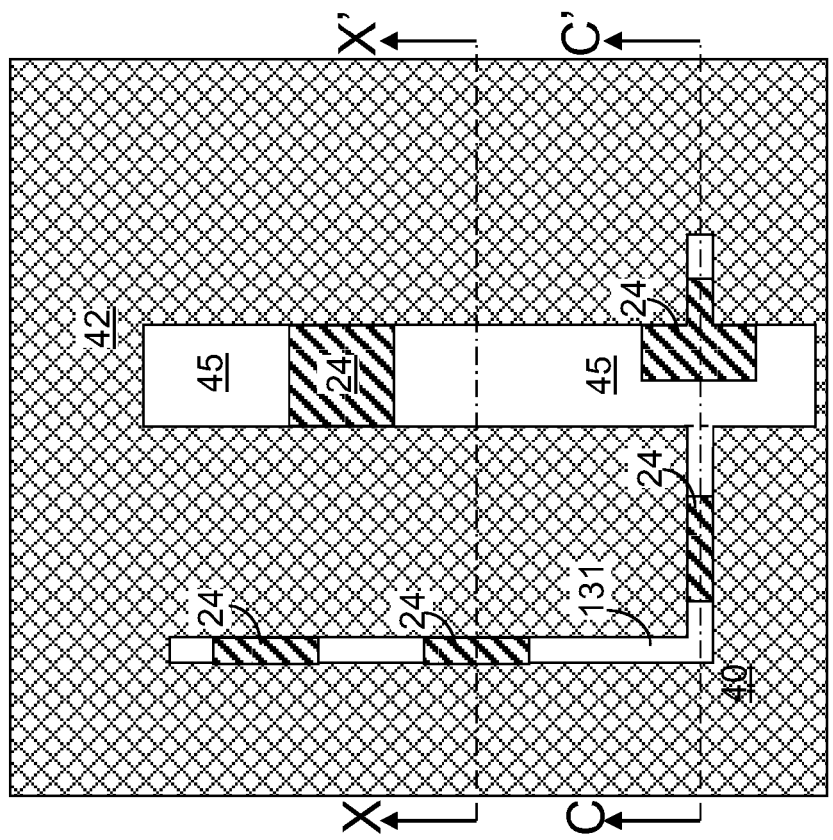
Figure 25A:
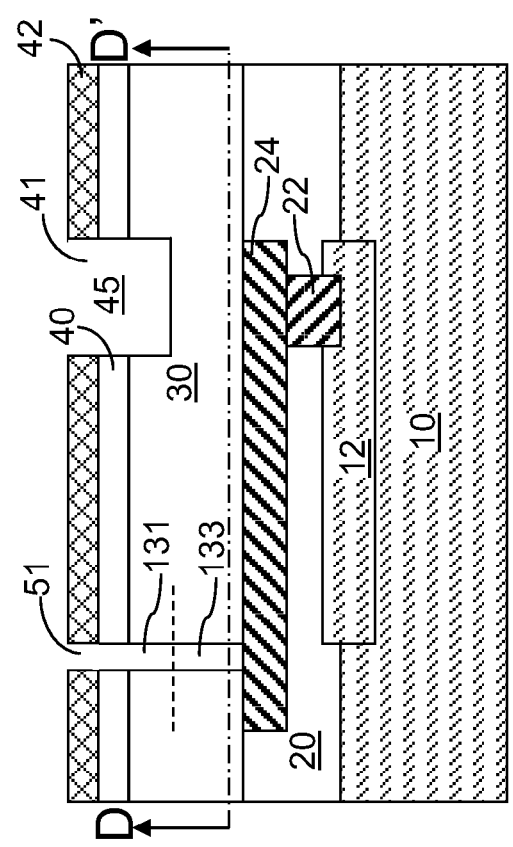
Figure 26B:
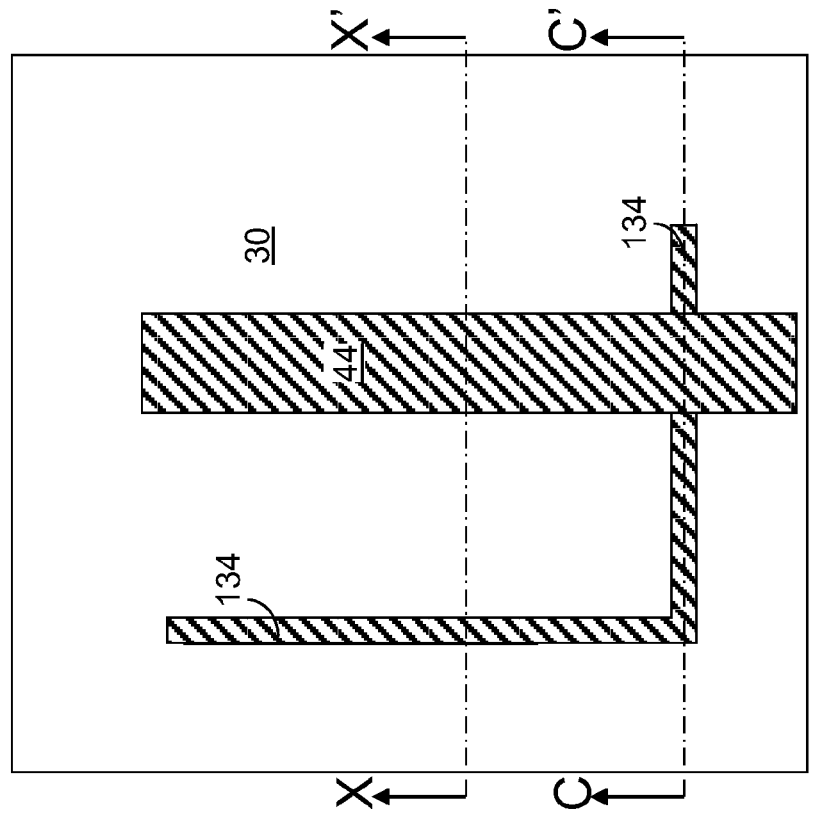
FIGS. 26A, 26, 26C, and 26D show the second exemplary structure of FIGS. 24A, 24B, 24C, and 24D after formation of at least one metal interconnect structure as embedded structures within the interconnect-level dielectric material layer.
Figure 26A:
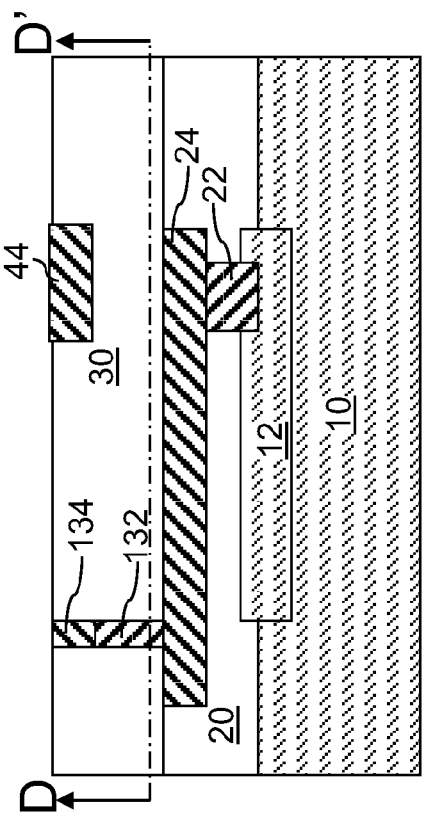
Figure 26D:
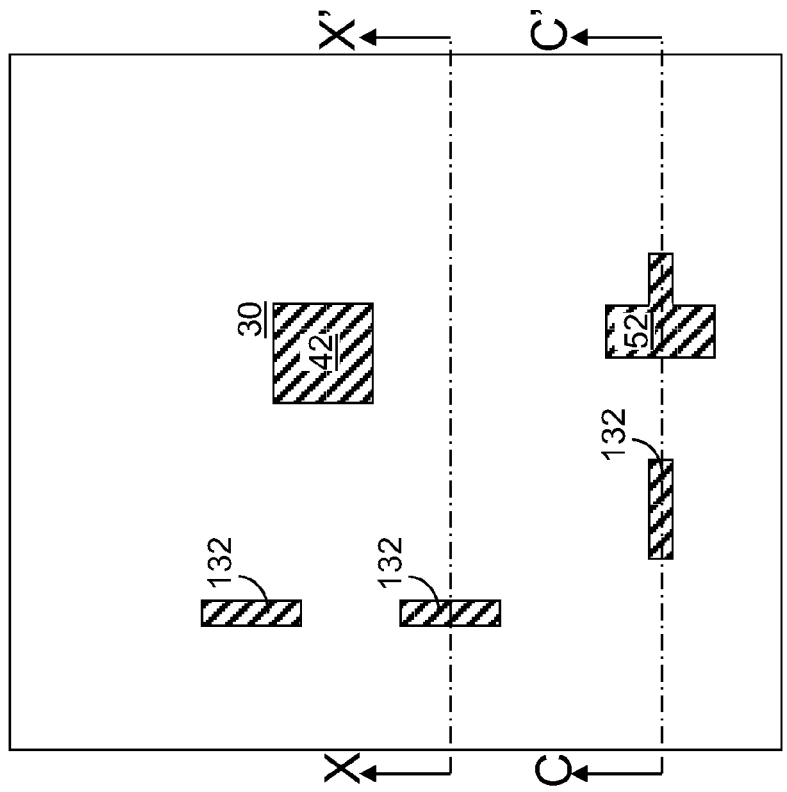
Figure 26C:
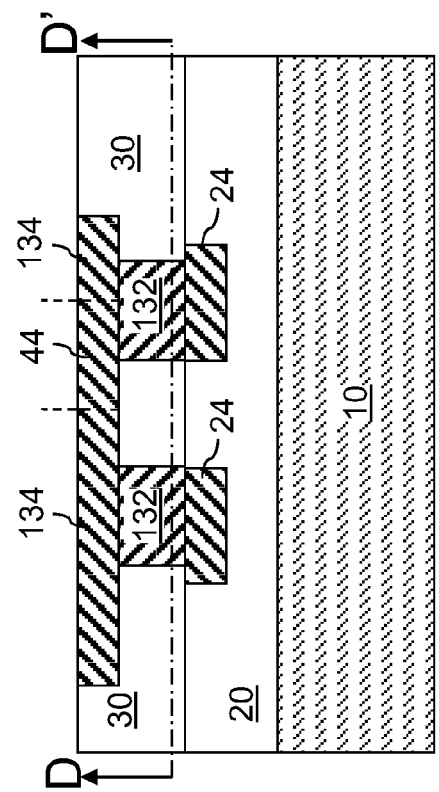

Referring to FIGS. 24A and 24B, the via-level ARC layer 112 and the via-level optical planarizing layer 110 are removed selective to the metallic layer 42, for example, by ashing.

Referring to FIGS. 25A, 25B, 25C, and 25D, the pattern in the metallic layer 42 is transferred through the dielectric masking material layer 40 and an upper portion of the interconnect-level dielectric material layer 30, for example, by another anisotropic etch that employs the metallic layer 42 as an etch mask. At least one sublithographic width line cavity 131, i.e., at least one cavity having a sublithographic width, is formed in the upper portion of the interconnect-level dielectric material layer 30 underneath the at least one sublithographic width line trench 51 within the metallic layer 42. Further, at least one lithographic width line cavity 45, i.e., at least one cavity having a lithographic width, is formed in the upper portion of the interconnect-level dielectric material layer 30 underneath the at least one lithographic width line trench 51 within the metallic layer 42. The pattern of the at least one sublithographic width line cavity 131 and the at least one lithographic width line cavity 45 replicates the pattern in the metallic layer 42 in the upper portion of the interconnect-level dielectric material layer 30.

The at least one first via hole 133, the at least one second via hole 43, and/or the at least one third via hole 53 are further extended downward during formation so that top surfaces of the at least one conductive line structure 24 and/or other conductive or semiconducting structures are exposed at the bottom of each of the at least one first via hole 133, the at least one second via hole 43, and/or the at least one third via hole 53.

Referring to FIGS. 26A, 26, 26C, and 26D, a conductive material such as a metal is deposited within the etched areas of the interconnect-level dielectric material layer 30, i.e., within the at least one first via hole 133, the at least one second via hole 43, and/or the at least one third via hole 53 and in the at least one sublithographic width line cavity 131 and the at least one lithographic width line cavity 45. The conductive material can be deposited, for example, by physical vapor deposition (PVD), electroplating, chemical vapor deposition (CVD), or a combination thereof. The conductive material is then planarized, for example, by a recess etch, chemical mechanical planarization (CMP), or a combination thereof. The metallic layer 42 can be removed either before the deposition of the conductive material or after the planarization of the conductive material.

At the end of the planarization and the removal of the metallic layer 42, at least one metal interconnect structure is formed as embedded structures within the interconnect-level dielectric material layer 30. Each metal interconnect structure can include at least one sublithographic conductive line structure 34 and/or at least one lithographic conductive line structure 44. Further, each metal interconnect structure can include at least one first conductive via structure 132, at least one second conductive via structure 42, and/or at least one third conductive via structure 52. A sublithographic conductive line structure 34 and a first conductive via structure 132 can have a same sublithographic width. The at least one lithographic conductive line structure 44 and the at least one second conductive via structures 42 can have lithographic widths. The at least one third conductive via structure can include a portion having a sublithographic width and another portion having a lithographic width. Any combination of a sublithographic conductive line structure 34, a lithographic conductive line structure 44, a first conductive via structure 132, a second conductive via structure 42, and/or a third conductive via structure 52 can be formed as a structure of integral construction, i.e., as a single contiguous piece.

The topmost surfaces of the at least one sublithographic conductive line structure 34 and the at least one lithographic conductive line structure 44 are coplanar with the topmost surface of the interconnect-level dielectric material layer 30. The at least one metal interconnect structure (134, 132, 33, 42, 52) includes portions having a lithographic width and portions having a sublithographic width. Additional interconnect level dielectric material layer can be formed above the interconnect-level dielectric material layer 30 as illustrated in FIGS. 16A and 16B.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a structure comprising:
    forming a stack including at least a metallic layer and a first low dielectric constant (low-k) dielectric material layer containing carbon on a substrate;
    exposing a sidewall of said first low-k dielectric material layer by forming a recessed region therein;
    forming a damaged sidewall portion by de-carbonizing a portion of said first low-k dielectric material layer located at said sidewall;
    filling said recessed region with a second low-k dielectric material layer and planarizing said second low-k dielectric material layer, wherein a top surface of said damaged sidewall portion is exposed;
    removing said damaged sidewall portion selective to an undamaged portion of said first low-k dielectric material layer and said second low-k dielectric material layer, wherein a line cavity is formed between said undamaged portion of said first low-k dielectric material layer and said second low-k dielectric material layer; and
    transferring a pattern of at least a portion of said line cavity into said metallic layer, wherein a trench of a constant width is formed within said metallic layer to form a patterned metallic layer.

2. The method of claim 1, wherein said stack further includes an interconnect-level dielectric material layer located below said metallic layer, and said method further comprises etching an area of said interconnect-level dielectric material layer that is less than an entire area of said trench in said patterned metallic layer.

3. The method of claim 2, wherein said etching of said area of said interconnect-level dielectric material layer is performed by applying a photoresist over said patterned metallic layer and lithographically patterning said photoresist layer before said etching of said area of said interconnect-level dielectric material layer, wherein said area of said interconnect-level dielectric material layer is the same as an area of intersection between a patterned area of said photoresist layer and said entire area of said trench of said constant width in said metallic layer.

4. The method of claim 3, further comprising applying an optical planarizing layer on said patterned metallic layer before applying said photoresist.

5. The method of claim 3, further comprising:
applying another photoresist over said patterned metallic layer after etching said area of said interconnect-level dielectric material layer;
lithographically patterning said other photoresist layer; and
etching of another area of said interconnect-level dielectric material layer, wherein said other area of said interconnect-level dielectric material layer is the same as an area of intersection between a patterned area of said other photoresist layer and said entire area of said trench in said patterned metallic layer.

6. The method of claim 5, wherein one of said area of said interconnect-level dielectric material layer and said other area of said interconnect-level dielectric material layer is an area of a via cavity, and the other of said area of said interconnect-level dielectric material layer and said other area of said interconnect-level dielectric material layer is an area of a line cavity, wherein said area of said line cavity includes said area of said via cavity.

7. The method of claim 3, further comprising filling etched areas within said interconnect-level dielectric material layer with a conductive material to form a metal interconnect structure having said constant width.

8. The method of claim 2, wherein said stack further includes a dielectric masking material layer formed between said interconnect-level dielectric material layer and said metallic layer, and said method further includes transferring a pattern in said metallic layer into said dielectric masking material layer.

9. The method of claim 8, further comprising converting said undamaged portion of said first low-k dielectric material layer and said second low-k dielectric material layer into a silicon-oxide-containing layer.

10. The method of claim 9, further comprising removing said silicon-oxide-containing layer, wherein an upper portion of said dielectric masking material layer is removed during removal of said silicon-oxide-containing layer from underneath said pattern in said metallic layer.

11. The method of claim 8, further comprising forming a line trench in said dielectric masking material layer within an area that is a subset of said entire area of said trench in said patterned metallic layer.

12. The method of claim 11, wherein said area of said line trench in said dielectric masking material layer is less than said entire area of said trench in said patterned metallic layer.

13. The method of claim 12, further comprising:
applying a photoresist over said dielectric masking material layer and said patterned metallic layer and patterning said photoresist;
forming said line trench in said dielectric masking material layer within an area that is an intersection of said entire area of said trench in said patterned metallic layer and an area of a pattern in said photoresist.

14. The method of claim 8, wherein said dielectric masking material layer includes a material selected from silicon oxide, silicon nitride, silicon oxynitride, an organosilicate glass including Si, C, O, H, and N.

15. The method of claim 1, wherein said first low-k dielectric material layer includes an organosilicate glass including Si, C, O, and H.

16. The method of claim 15, wherein said second low-k dielectric material layer includes methylated-hydrogen silsesquioxane (MSQ) or another organosilicate glass including Si, C, O, and H.

* * * * *